(12) United States Patent
Kim

(10) Patent No.: US 8,280,672 B2  
(45) Date of Patent: Oct. 2, 2012

(54) TRIMMING CIRCUIT OF SEMICONDUCTOR MEMORY APPARATUS AND TRIMMING METHOD THEREOF

(75) Inventor: Jee-Yul Kim, Ichon (KR)

(73) Assignee: SK hynix Inc. (KR)

( * ) Notice: Subject to any disclaimer, the term of this patent is extended or adjusted under 35 U.S.C. 154(b) by 718 days.

(21) Appl. No.: 12/347,041

(22) Filed: Dec. 31, 2008

(65) Prior Publication Data

US 2010/0090750 A1 Apr. 15, 2010

(30) Foreign Application Priority Data

Oct. 14, 2008 (KR) .................. 10-2008-0100549

(51) Int. Cl.
*G06F 19/00* (2011.01)
*H01H 37/76* (2006.01)

(52) U.S. Cl. .................................. 702/124; 327/525

(58) Field of Classification Search ............... 702/124, 702/57–59, 64–65, 81, 84, 108, 117–120, 702/127, 182–185, 189; 365/201, 208, 210.12, 365/225.7; 327/37, 100, 306, 334, 525, 540; 324/76.11, 522–523, 527, 537, 602, 605–606
See application file for complete search history.

(56) References Cited

U.S. PATENT DOCUMENTS

| 6,184,720 | B1 | 2/2001 | Kim et al. |
| 7,352,230 | B2 * | 4/2008 | An .................................. 327/334 |
| 7,710,788 | B2 * | 5/2010 | Jeon et al. ................. 365/185.33 |
| 7,719,340 | B2 * | 5/2010 | An .................................. 327/332 |
| 2002/0105452 | A1 | 8/2002 | Clapp et al. |

FOREIGN PATENT DOCUMENTS

| JP | 2006-344793 | 12/2006 |
| JP | 2008-053259 | 3/2008 |
| KR | 1019970051334 | 7/1997 |

* cited by examiner

*Primary Examiner* — Toan M Le
(74) *Attorney, Agent, or Firm* — Baker & McKenzie LLP

(57) ABSTRACT

A trimming circuit for a semiconductor memory apparatus includes a trimming code generator configured to provide a trimming code signal group by performing one of addition and subtraction using a test mode signal and a fuse coding signal, and an internal voltage generator configured to provide trimmed voltage in response to the trimming code signal group as output voltage.

28 Claims, 17 Drawing Sheets

TRIMMING CIRCUIT OF SEMICONDUCTOR MEMORY APPARATUS AND TRIMMING METHOD THEREOF

CROSS-REFERENCES TO RELATED APPLICATION

The present application claims priority under 35 U.S.C. 119(a) to Korean application number 10-2008-0100549, filed on Oct. 14, 2008, in the Korean Intellectual Property Office, which is incorporated herein by reference in its entirety as if set forth in full.

BACKGROUND

1. Technical Field

The embodiments described herein relate to a semiconductor memory apparatus, and more particularly, to a trimming circuit for a semiconductor memory apparatus.

2. Related Art

In general, since external supply voltages or ground voltages may have instant variations in noise and voltage levels, a circuit in a semiconductor memory apparatus requires voltages having a stable level. Accordingly, the semiconductor memory apparatus generates internal voltages having various levels by using an external supply voltage or a ground voltage.

The semiconductor memory apparatus includes an internal voltage generating circuit to generate internal voltage using external input voltage. If the internal voltage has no desired level, a fuse is cut if the level of the internal voltage is too high or the internal voltage is properly trimmed using a code signal so that the internal voltage can be output at a target level. For example, fuse cutting is performed in a wafer level for trimming. However, when the trimming is required after a package process, the trimming for the internal voltage may not be precisely performed even if a code signal is used since a preset base voltage is primarily trimmed when the trimming operation is performed in a package level. Here, in order to trim the internal voltage more exactly, the trimming process must be performed by taking into consideration the fuse cutting in the wafer level.

SUMMARY

A trimming circuit of a semiconductor memory apparatus capable of efficiently trimming internal voltage is described herein.

In one aspect, a trimming circuit for a semiconductor memory apparatus includes a trimming code generator configured to provide a trimming code signal group by performing one of addition and subtraction using a test mode signal and a fuse coding signal, and an internal voltage generator configured to provide trimmed voltage in response to the trimming code signal group as output voltage.

In another aspect, a trimming circuit for a semiconductor memory apparatus includes a trimming code generator configured to provide a trimming code signal group according to a decoding result of the fuse cutting information in response to a trimming base enable signal that determines reception of the fuse cutting information in a wafer level, or provide the trimming code signal group after performing an operation relative to the decoding signal according to a test mode signal, and an internal voltage generator configured to provide voltage trimmed in response to the trimming code signal group as output voltage.

In another aspect, a trimming circuit for a semiconductor memory apparatus includes a plurality of internal voltage generators, each configured to generate various trimming target internal voltages, a test mode controller configured to generate a plurality of voltage control signals, each corresponding to one of the plurality of trimming target internal voltages, and a calculator block controlled by the plurality of voltage control signals and configured to selectively provide a trimming code signal group corresponding to each of the plurality of internal voltage generators by using fuse coding information of each of the plurality of internal voltage generators.

In another aspect, a method of trimming a semiconductor memory apparatus includes providing a fuse coding signal by decoding fuse cutting information in a wafer level, decoding the test mode signal, providing a fuse encoding signal having a plurality of bits by encoding the fuse coding signal, providing an addition and subtraction control signal having the plurality of bits, an addition flag signal, and a subtraction flag signal by encoding an output signal of the first decoder, performing an addition operation relative to the fuse encoding signal, the addition and subtraction control signal, the addition flag signal, and the subtraction flag signal, providing the trimming code signal group by decoding an output signal of the adder block, and providing trimmed voltage in response to the trimming code signal group as output voltage.

In another aspect, a method of trimming a semiconductor memory apparatus includes generating a plurality of trimming target internal voltages, generating a plurality of voltage control signals, each corresponding to one of the plurality of trimming target internal voltages, and providing a trimming code signal group corresponding to each of the plurality of internal voltage generators by using fuse coding information of each of the plurality of internal voltage generators based upon the plurality of voltage control signals.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
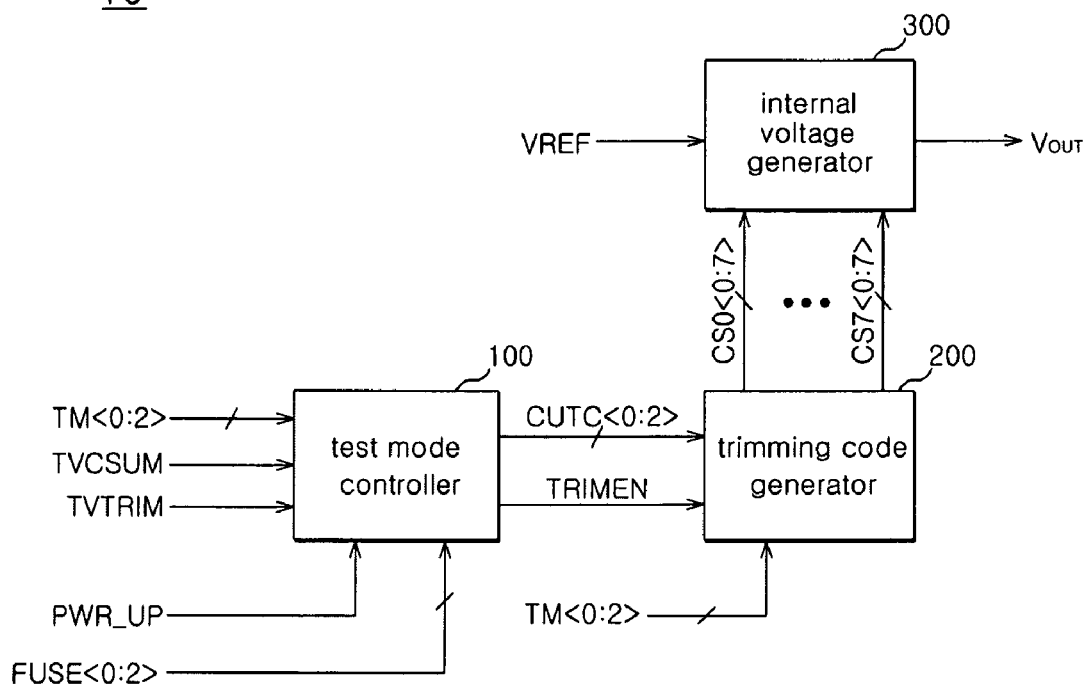
FIG. 1 is a schematic block diagram of an exemplary trimming circuit for a semiconductor memory apparatus according to one embodiment.

FIG. 1 is a schematic block diagram of an exemplary trimming circuit for a semiconductor memory apparatus according to one embodiment. In FIG. 1, the trimming circuit 10 can be configured to include a test mode controller 100, a trimming code generator 200 and an internal voltage generator 300.

The test mode controller 100 can be configured to receive test mode signals 'TM<0:2>', a trimming target trimming target voltage flag signal 'TVCSUM', a trimming flag signal 'TVTRIM', a power-up signal 'PWR_UP' and fuse signals 'FUSE<0:2>' to provide trimming information signals 'CUTC<0:2>' and a trimming base control signal 'TRIMEN'. Here, the test mode controller 100 can be configured to provide the trimming information signals 'CUTC<0:2>', which can trim target voltages, such as at least one of a core voltage VCORE, a substrate bias voltage VBB and high voltage VPP, in response to the trimming target voltage flag signal 'TVCSUM' and the trimming flag signal 'TVTRIM'.

For example, the test mode controller 100 can be configured to provide test mode coding information signals 'TM<0:2>' or fusing information signals 'FUSE<0:2>' as the trimming information signals 'CUTC<0:2>' in response to a level of the trimming flag signal 'TVTRIM'. In addition, the test mode controller 100 can be configured to provide the trimming base control signal 'TRIMEN' to serve as a control signal capable of reflecting physical information of a fuse, which has been cut in a wafer level when performing the trimming operation, in a package level. Here, a base level, which can serve as a reference to determine increases/decreases of a code value, can vary depending upon a selected trimming code group (not shown). Accordingly, the base level of the trimming code group (not shown) selected in the package level can be changed to a trimmed level, which can be obtained by fuse cutting, in the wafer level.

In FIG. 1, the trimming code generator 200 can be configured to provide a plurality of trimming coding signal groups 'CS0<0:7>', . . . , 'CS7<0:7>' for a test mode in response to the trimming base control signal 'TRIMEN', the trimming information signals 'CUTC<0:2>', and the test mode signals 'TM<0:2>'. Here, the trimming code generator 200 can be configured to output one coding signal group, which corresponds to changed base voltage, of the trimming coding signal groups 'CS0<0:7>', . . . , 'CS7<0:7>' in response to the trimming base control signal 'TRIMEN'.

For example, when the trimming base control signal 'TRIMEN' is activated, the trimming code generator 200 can be configured to select one coding signal group based on the trimming information signals 'CUTC<0:2>'. In addition, one selected from the trimming coding signal groups 'CS0<0:7>', . . . , 'CS7<0:7>' can be provided by decoding the test mode signals 'TM<0:2>', wherein the trimming code generator 200 can include a plurality of decoding circuits (not shown).

In FIG. 1, the internal voltage generator 300 can be configured to provide an output voltage VOUT having a predetermined level in response to reference voltage $V_{ref}$ and one of the trimming coding signal groups 'CS0<0:7>', . . . , 'CS7<0:7>'. For example, the internal voltage generator 300 can be configured to trim internal voltage corresponding to a signal of one of the trimming coding signal groups 'CS0<0:7>', . . . , 'CS7<0:7>', thereby providing desired output voltage VOUT.

Figure 2:
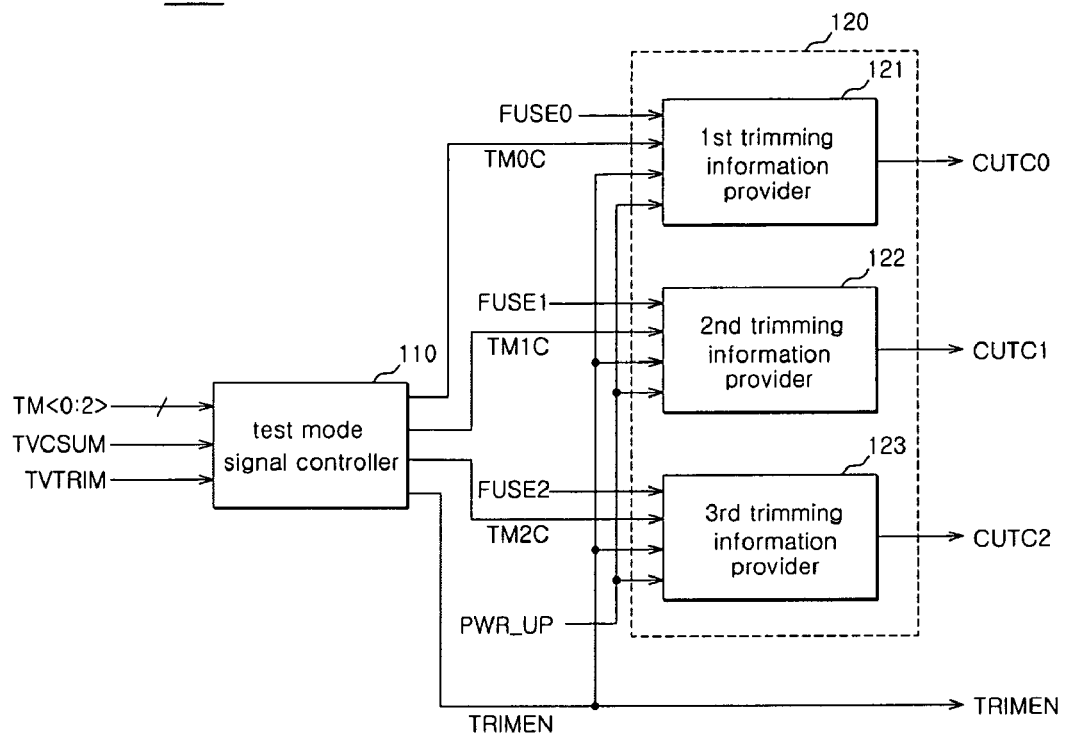
FIG. 2 is a schematic block diagram of an exemplary test mode controller capable of being implemented in the circuit of FIG. 1 according to one embodiment.

FIG. 2 is a schematic block diagram of an exemplary test mode controller capable of being implemented in the circuit of FIG. 1 according to one embodiment. In FIG. 2, the test mode controller 100 can be configured to include a test mode signal controller 110 and a trimming information block 120.

The test mode signal controller 110 can be configured to receive the test mode signals 'TM<0:2>', the trimming target voltage flag signal 'TVCSUM', and the trimming flag signal 'TVTRIM' to provide first to third test signals 'TM0C' to 'TM2C' and the trimming base control signal 'TRIMEN'. In addition, the test mode signal controller 110 can be configured to provide the test mode signals 'TM<0:2>' as the test signals 'TM0C' to 'TM2C' that can serve as trimming code signals when the trimming flag signal 'TVTRIM' is deactivated to a low level.

The trimming information block 120 can include first to third trimming information providers 121 to 123 that can receive the first to third test signals 'TM0C' to 'TM2C' and the fuse signals 'FUSE<0:2>', respectively, and can commonly receive the trimming flag signal 'TVTRIM' and the power-up signal 'PWR_UP', thereby providing the trimming information signals 'CUTC<0:2>'. Here, the trimming information block 120 can provide the fuse signals 'FUSE<0:2>', which can serve as the fuse cutting information, or the first to third test signals 'TM0C' to 'TM2C', which can serve as the trimming coding information, as the trimming information signals 'CUTC<0:2>' in response to the trimming base control signal 'TRIMEN'.

Figure 3:
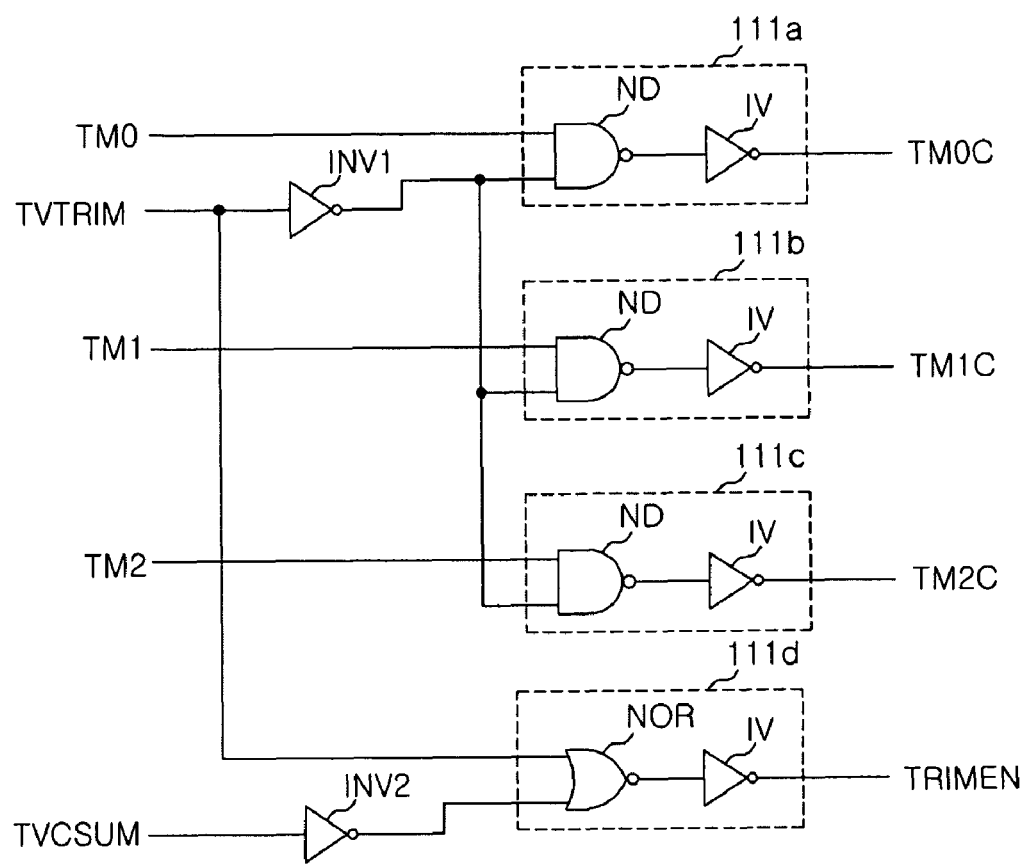
FIG. 3 is a schematic diagram of an exemplary circuit for the test mode signal controller of FIG. 2 according to one embodiment.

FIG. 3 is a schematic diagram of an exemplary circuit for the test mode signal controller of FIG. 2 according to one embodiment. In FIG. 3, the test mode signal controller 110 can be configured to include first to fourth signal receivers 111a to 111d.

Each of the first to third signal receivers 111a to 111c can include an NAND gate ND and an inverter IV serially connected with each other. Here, the first to third signal receivers 111a to 111c can commonly receive an inverted trimming flag signal 'TVTRIM', and can receive the first to third test mode signals 'TM<0:2>' to provide the first to third test signals 'TM0C' to 'TM2C'. When the trimming flag signal 'TVTRIM' is deactivated to a low level, the first to third signal receivers 111a to 111c can provide the first to third test signals 'TM0C' to 'TM2C', which can have level substantially identical to those of the first to third test mode signals 'TM<0:2>', respectively. If the trimming flag signal 'TVTRIM' is activated to a high level, the first to third signal receivers 111a to 111c can provide the first to third test signals 'TM0C' to 'TM2C' having a fixed low level, respectively. As a result, the external test mode signals 'TM<0:2>' can be prevented from being recognized when the trimming flag signal 'TVTRIM' is activated to the high level.

In FIG. 3, the fourth signal receiver 111d can include a NOR gate NOR and an inverter IV serially connected with each other. Here, the fourth signal receiver 111d can be configured to provide the trimming base control signal 'TRIMEN' in response to the trimming target voltage flag signal 'TVCSUM' and the trimming flag signal 'TVTRIM'. For example, the fourth signal receiver 111d can provide the trimming target voltage flag signal 'TVCSUM' and the trimming base control signal 'TRIMEN' having an inverted level when the trimming flag signal 'TVTRIM' has the deactivated low level. However, when the trimming flag signal 'TVTRIM' has the activated high level, the fourth signal receiver 111d can provide the trimming base control signal 'TRIMEN' having an activated high level. Accordingly, the activated trimming base control signal 'TRIMEN' can serve as a control signal for recognizing fuse cutting information in the wafer level as new base voltage in the package level, instead of preset base voltage.

An exemplary operation in which the trimming information block 120 controls the trimming information signals 'CUTC<0:2>' by receiving the first to third test signals 'TM0C' to 'TM2C' and the trimming base control signal 'TRIMEN' will be described with reference to FIG. 4.

Figure 4:
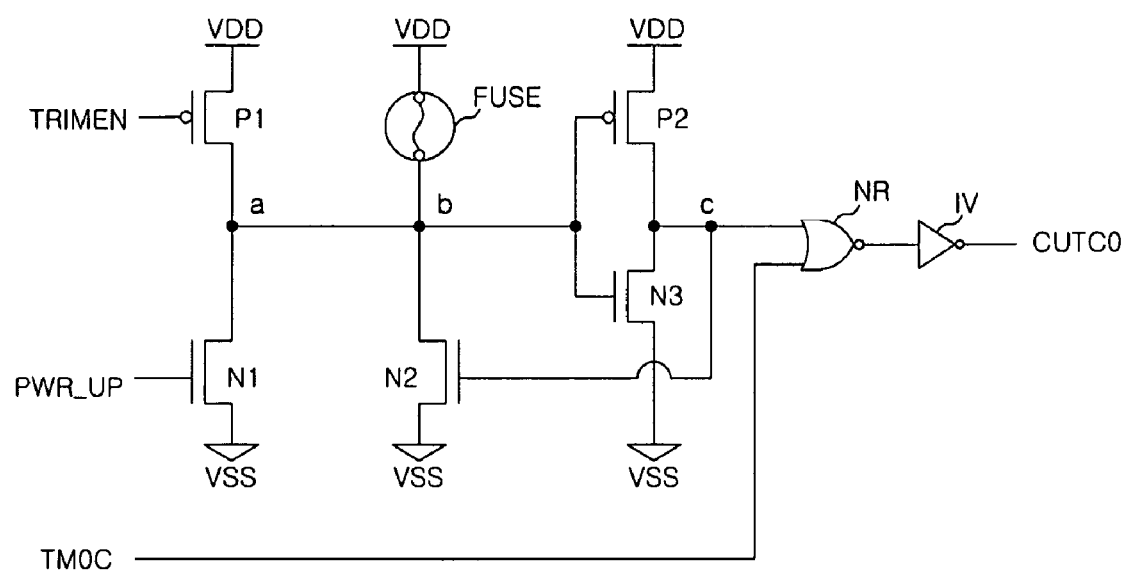
FIG. 4 is a schematic circuit diagram of an exemplary first trimming information provider capable of being implemented in the trimming information block of FIG. 2 according to one embodiment.

FIG. 4 is a schematic circuit diagram of an exemplary first trimming information provider capable of being implemented in the trimming information block of FIG. 2 according to one embodiment. For the purposes of convenience, FIG. 4 shows only the first trimming information provider 121 of the trimming information block 120 since the first trimming information provider 121 can have a circuit configuration and operational principles substantially similar to those of the second and third trimming information providers 122 and 123, except for a received signal.

In FIG. 4, the first trimming information provider 121 can include a plurality of PMOS transistors P1 and P2 and a plurality of NMOS transistors N1 to N3. For example, the first PMOS transistor P1 can include a gate terminal receiving the trimming base control signal 'TRIMEN', a source terminal connected with external supply voltage VDD, and a drain terminal connected with a node (a). The first NMOS transistor N1 can include a gate terminal receiving the power-up signal 'PWR_UP', a drain terminal connected with the node (a), and a source terminal connected with ground voltage VSS.

In addition, a fuse can be provided between the external supply voltage VDD and a node (b). For example, the second NMOS transistor N2 can include a gate terminal connected with a node (c), a drain terminal connected with the node (b), and a source terminal connected with the ground voltage VSS. The second PMOS transistor P2 can include a gate terminal connected with the node (b), a source terminal connected with the external supply voltage VDD, and a drain terminal connected with the node c. The third NMOS transistor N3 can include a gate terminal connected with the node (b), a source terminal connected with the ground voltage VSS, and a drain terminal connected with the node (c).

In FIG. 4, a NOR gate NR can receive the first test signal 'TM0C' and a signal of the node (c) to perform a NOR gating operation. In addition, an inverter IV can invert an output signal of the NOR gate NR to provide the first trimming information signal 'CUTC0'.

An exemplary operation of the first trimming information provider 121 will be described with reference to FIGS. 1-4. Description will be given on the presumption that fuses have been physically cut in the wafer level such that a predetermined voltage level is output.

In order to reflect a trimming state in the wafer level, the power-up signal 'PWR_UP' can be supplied to the first trimming information provider 121 in the package level to initialize the first trimming information provider 121. With regard to the initialization operation, since the power-up signal 'PWR_UP' is a pulse signal, the first NMOS transistor N1 can be turned ON when the power-up signal 'PWR_UP' is at a high level. Accordingly, the node (a) can become a low level and the second PMOS transistor P2 can be turned ON so that the node (c) can become a high level. Next, the NOR gate NR receiving the high level can provide an output signal at a low level regardless of a level of the first test signal 'TM0C' so that the first trimming information signal 'CUTC0' can be initialized to a high level.

Then, the power-up signal 'PWR_UP' can be deactivated to a low level. Here, a signal of the node (b) can be determined according to whether the fuse has been cut. If the fuse has been cut, then the node (b) can maintain a low level in an initialization state because the node (b) can be latched by the second NMOS transistor N2. Accordingly, the second PMOS transistor P2 can be turned ON so that the first trimming information signal 'CUTC0' can become a high level.

However, if the fuse has not been cut, then the signal of the node (b) can be changed to a high level after the initialization operation. Accordingly, the third NMOS transistor N3 can be turned ON so that the node (c) can become a low level. Since the NOR gate NR can receive a low level through one receiving terminal thereof, output of the NOR gate NR can be determined by the level of the first test signal 'TM0C'.

In addition, levels of the first to third test signals 'TM0C' to 'TM2C' can be combined to obtain a binary code capable of increasing or decreasing a trimming level. First, an exemplary case in which the trimming base control signal 'TRIMEN' is at a high level will be described.

As illustrated in FIG. 3, the first to third test signals 'TM0C' to 'TM2C' can be at a low level. Accordingly, the first PMOS transistor P1 is not turned ON by the trimming base control signal 'TRIMEN' with the high level. Since the NOR gate NR can receive the signal of the node (c) and the first test signal 'TM0C' having the low level, the NOR gate NR can output a high level and the first trimming information signal 'CUTC0' can become a low level.

However, if the trimming base control signal 'TRIMEN' is at a low level, the first PMOS transistor P1 can be turned ON, the node (a) can become a high level, and the third NMOS transistor N3 can be turned ON so that the node (c) can become the low level. Accordingly, a level of a signal output from the NOR gate NR can be determined by the level of the first test signal 'TM0C'.

For example, if the trimming base control signal 'TRIMEN' is at the high level, then the first test signal TM0C can be determined by cutting information of the fuse. However, if the trimming base control signal 'TRIMEN' is at the low level, then the first trimming information signal 'CUTC0' can be provided by the first test signal TM0C corresponding to an external test mode signal regardless of cutting of the fuse.

In summary, the trimming base control signal 'TRIMEN' having the high level can be provided so that the fuse cutting information can be provided as the first trimming information signal 'CUTC0'. Then, the first trimming information signal 'CUTC0' can be decoded so that the fuse cutting information in the wafer level can be stored. Thus, a trimming result in the wafer level can be reflected when performing the trimming operation in the package level.

Figure 5:
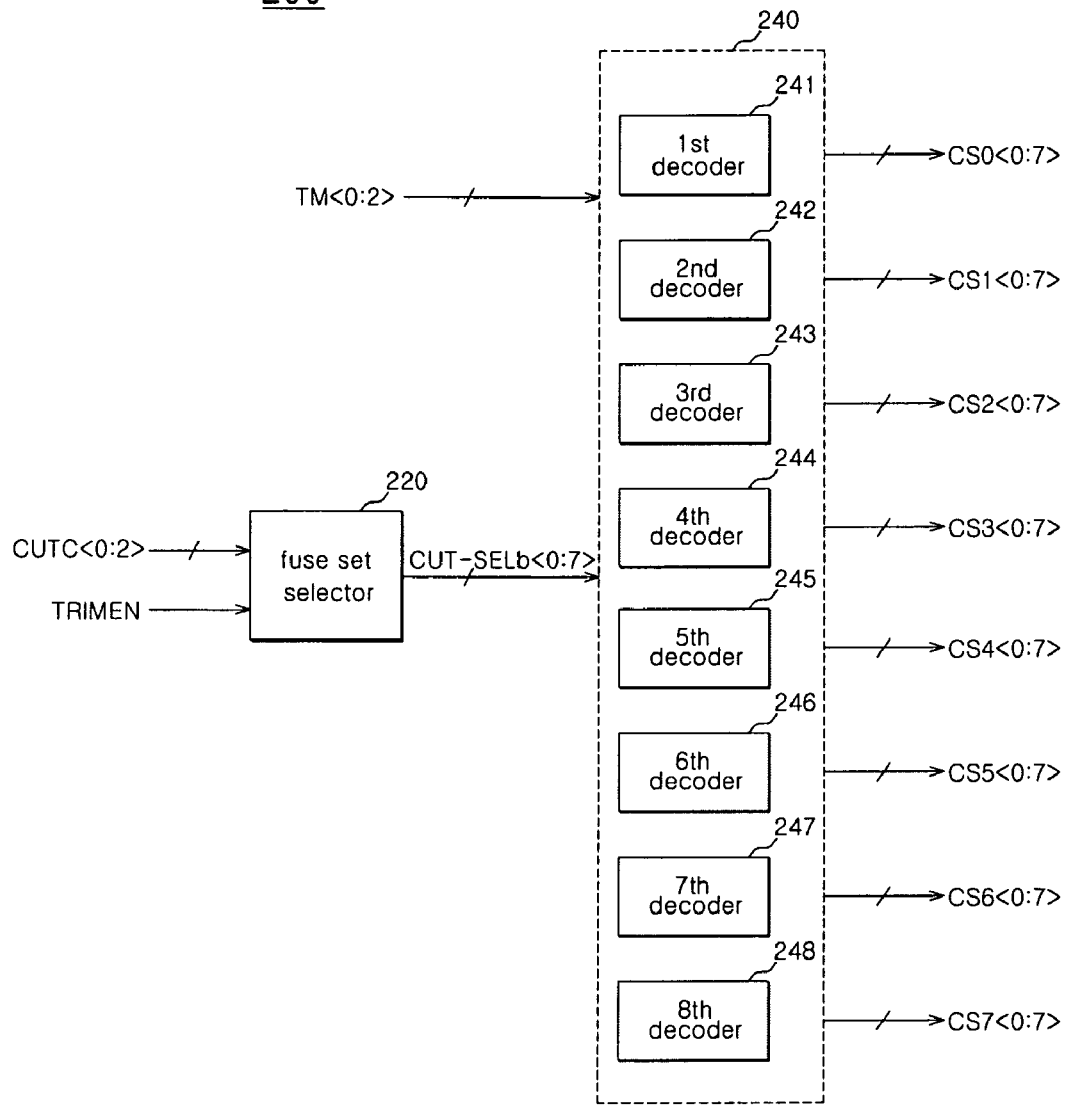
FIG. 5 is a schematic block diagram of an exemplary trimming code generator capable of being implemented in the circuit of FIG. 1 according to one embodiment.
Figure 6:
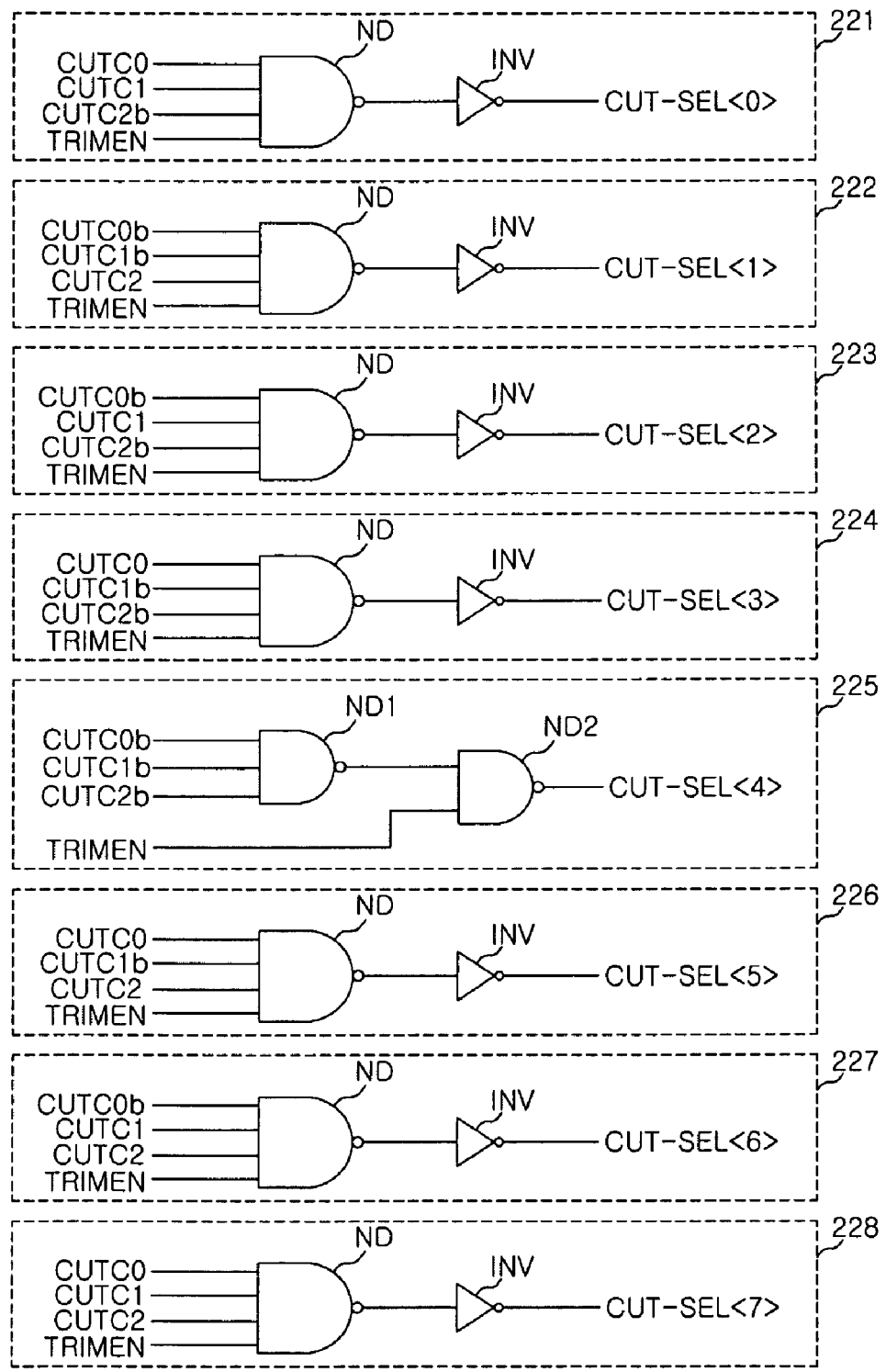
FIG. 6 is a schematic circuit diagram of an exemplary fuse set selector capable of being implemented in the generator of FIG. 5 according to one embodiment.
Figure 7:
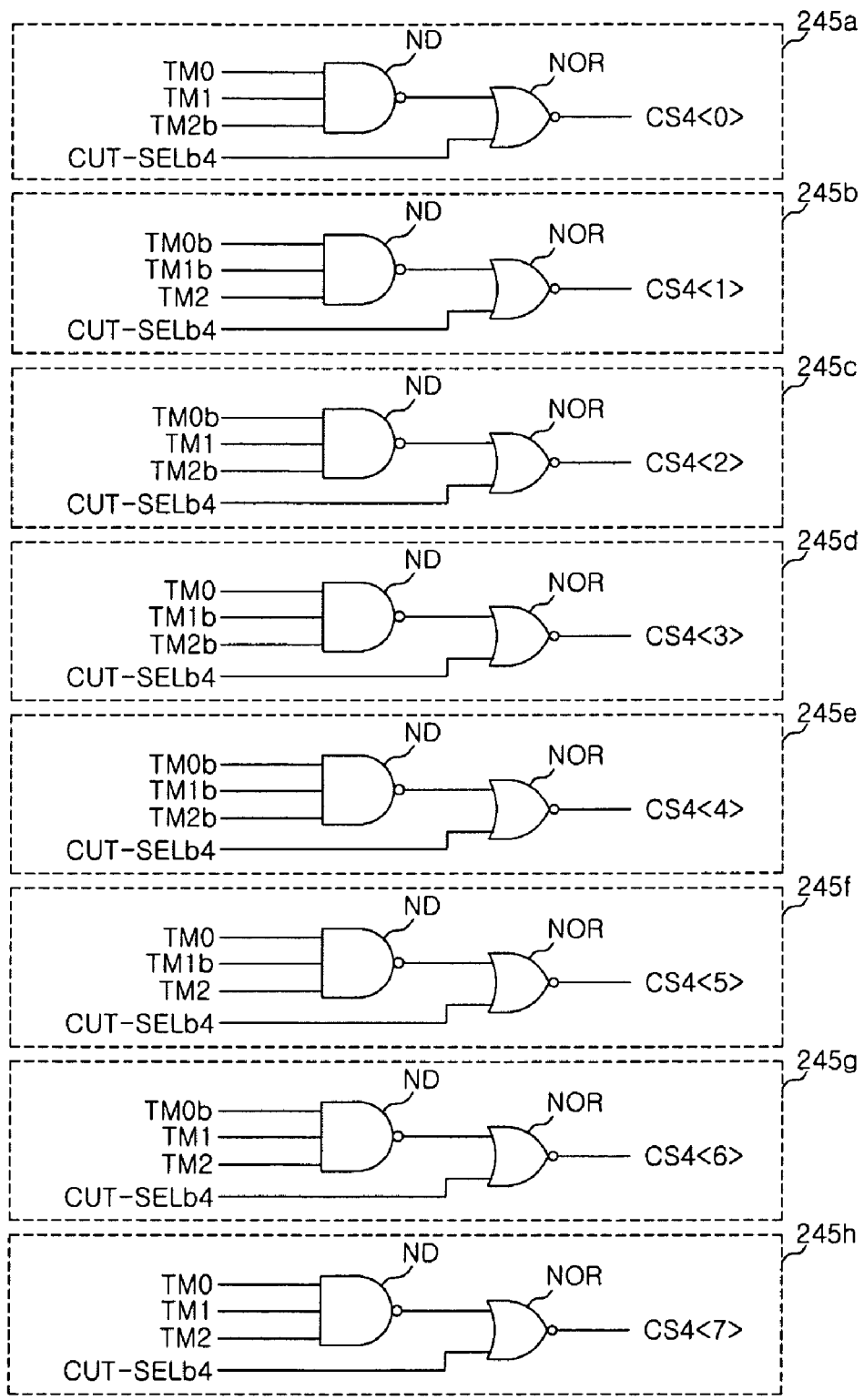
FIG. 7 is a schematic circuit diagram of an exemplary decoding block capable of being implemented in the generator of FIG. 5 according to one embodiment.

FIG. 5 is a schematic block diagram of an exemplary trimming code generator capable of being implemented in the circuit of FIG. 1 according to one embodiment, FIG. 6 is a schematic circuit diagram of an exemplary fuse set selector capable of being implemented in the generator of FIG. 5 according to one embodiment, and FIG. 7 is a schematic circuit diagram of an exemplary decoding block capable of being implemented in the generator of FIG. 5 according to one embodiment.

In FIGS. 5-7, the trimming code generator 200 can be configured to include the fuse set selector 220 and the decoding block 240.

The fuse set selector 220 can be configured to receive the first to third trimming information signals 'CUTC<0:2>' and the trimming base control signal 'TRIMEN' to provide a plurality of fuse set selection signals 'CUT_SEL<0:7>'. If the trimming base control signal 'TRIMEN' is activated, the fuse set selector 220 can provide modified trimming base voltage information by reflecting the fuse cutting information. The number of the fuse set selection signals 'CUT_SEL<0:7>' can be substantially identical to that obtained by decoding the number of the first to third trimming information signals 'CUTC<0:2>'. Accordingly, the fuse set selector 220 can include a decoding circuit.

For example, in FIG. 6, the fuse set selector 220 can include first to eighth signal coders 221 to 228. Here, the first to fourth signal coders 221 to 224 and the sixth to eighth signal coders 226 to 228 can include an NAND gate ND and an inverter INV serially connected with each other, respectively. The first to eighth signal coders 221 to 228 can receive combination of the first to third trimming information signals 'CUTC0' to 'CUTC2' and inverted signals thereof, and can commonly receive the trimming base control signal 'TRIMEN'. The fifth signal coder 225 can provide the fuse set selection signal 'CUT_SEL<4>' activated regardless of the levels of the first to third trimming information signals 'CUTC0' to 'CUTC2' when the trimming base control signal 'TRIMEN' is at the low level. Accordingly, a base information signal having a preset voltage level (set by a subsequent decoding operation) corresponding to the fuse set selection signal 'CUT_SEL<4>' and serving as a reference of trimming can be provided when the trimming base control signal 'TRIMEN' is set to the low level. For example, the trimming base voltage (or the base information signal) can serve as trimming reference voltage to be increased or decreased from the base voltage when the voltage level is increased or decreased for the trimming.

In FIG. 6, the first to eighth signal coders 221 to 228 can code the combination of the first to third trimming information signals 'CUTC0' to 'CUTC2' and inverted signals thereof when the trimming base control signal 'TRIMEN' is activated to the high level. When the trimming base control signal 'TRIMEN' is at the high level, the fuse cutting information can be provided as the first to third trimming information signals 'CUTC0' to 'CUTC2' in the above description. Accordingly, when the trimming base control signal 'TRIMEN' is at the high level, the first to third trimming information signals 'CUTC0' to 'CUTC2' can be decoded to newly activate trimming base information signals reflecting the fuse cutting state.

However, when the trimming base control signal 'TRIMEN' is at the low level, the fuse cutting information may not be recognized, and the test signals 'TM0C' to 'TM2C' can be provided as the first to third trimming information signals 'CUTC0' to 'CUTC2' in the above description. Thus, the preset trimming base voltage can be provided without reflecting the fuse cutting information.

In FIG. 5, the decoding block 240 can include first to eighth decoders 241 to 248 corresponding to the fuse set selection signals 'CUT_SELb<0:7>'. For the purposes of convenience, the 'CUT_SELb<0:7>' and the 'CUT_SEL<0:7>' can represent the same signal name. For example, the 'CUT_SELb<0:7>' can have a level inverse to that of the 'CUT_SEL<0:7>', and the 'CUT_SELb<0:7>' and the 'CUT_SEL<0:7>' can refer to the same fuse set selection signals. In addition, the decoding block 240 can receive the first to third test mode signals 'TM<0:2>' and the fuse set selection signals 'CUT_SELb<0:7>' to provide a plurality of trimming coding signal groups 'CS0<0:7>', . . . , 'CS7<0:7>' for a test mode. Here, for example, the decoding block 240 includes eight decoders.

In FIG. 5, the decoding block 240 can be configured to drive one of the decoders 241 to 248 in response to one activated fuse set selection signal to provide a corresponding trimming coding signal group.

In FIG. 7, the fifth decoder 245 can be representative of one of the exemplary decoders 241 to 248 in FIG. 5. Here, the fifth decoder 245 can be activated in response to the fifth fuse set selection signal 'CUT_SELb4' to provide the fourth trimming coding signal groups 'CS4<0:7>'. For example, the fifth decoder 245 can include first to eighth coding units 245a to 245h.

Each of the first to eighth coding units 245a to 245h can include an NAND gate ND and an NOR gate NOR serially connected with each other. The first to eighth coding units 245a to 245h can receive combinations of the first to test mode signals 'TM0' to 'TM2' and inverted signals thereof, and can commonly receive the fifth fuse set selection signal 'CUT_SELb4'.

Other decoders not shown in FIG. 5 can include an NAND gate ND and an NOR gate NOR, respectively, to decode the first to third test mode signals 'TM0' to 'TM2' in a similar way as the fifth decoder 245, thereby providing the trimming coding signal groups for a test mode. In FIG. 7, an activated code signal of the fourth trimming coding signal groups 'CS4<0:7>' can represent trimming variation information of a target voltage. If the second trimming coding signal 'CS4<1>' is activated by the fifth decoder 245, then the second trimming coding signal 'CS4<1>' can represent that the second trimming coding signal 'CS4<1>' has trimming information increased from the base voltage by '1UP'. In addition, trimming base voltage can vary depending upon the decoders 241 to 248, and thus, the trimming variation information of the code signals 'CS<0:7>' can vary.

As described above, one fuse set selection signal can be activated by the combination of the first to third test mode signals 'TM0' to 'TM2' and the inverted signals thereof. The newly activated fuse set selection signal can activate one of the decoders, and can serve as a trimming base information signal in the package level. For example, the newly activated fuse set selection signal may be the sixth fuse set selection signal 'CUT_SELb5.' Accordingly, the sixth fuse set selection signal 'CUT_SELb5', which is the new preset base information signal corresponding to the first to third trimming information signals 'CUTC0' to 'CUTC2', can be activated, instead of the fifth fuse set selection signal 'CUT_SELb4' that is the preset base information signal. Furthermore, as the sixth fuse set selection signal 'CUT_SELb5' reflecting a fuse cutting state of a wafer is activated, the trimming base voltage can be changed.

Figure 8:
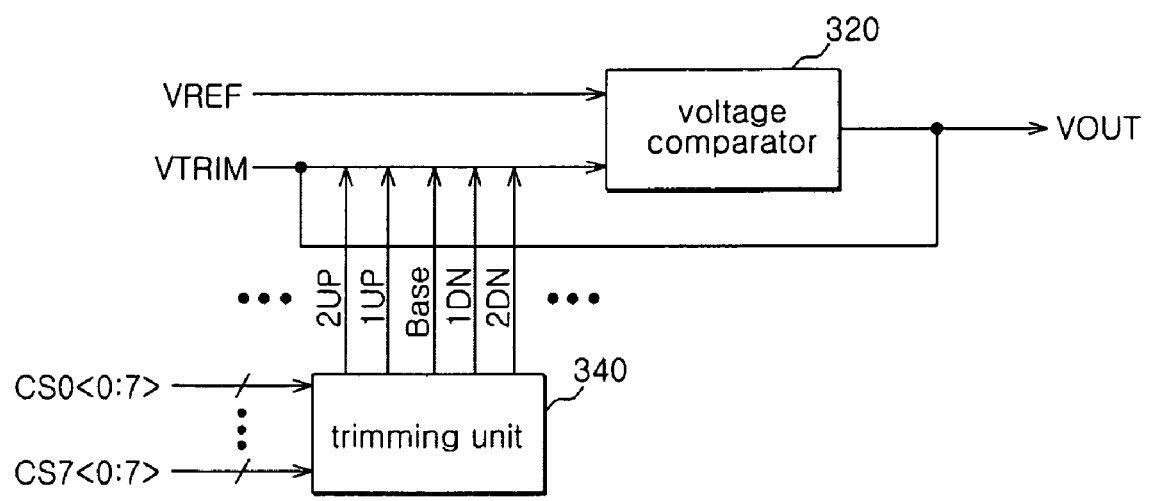
FIG. 8 is a schematic block diagram of an exemplary internal voltage generator.

FIG. 8 is a schematic block diagram of an exemplary internal voltage generator. In FIG. 8, the internal voltage generator 300 can be configured to include a voltage comparator 320 and a trimming unit 340.

The voltage comparator 320 can be configured to provide the output voltage VOUT corresponding to the reference voltage $V_{ref}$.

However, if the output voltage VOUT does not satisfy a predetermined level, the voltage comparator 320 can provide output voltage VOUT in response to trimming voltage VTRIM.

The trimming unit 340 can trim the output voltage VOUT in response to an activated one of the trimming coding signal groups 'CS0<0:7>', . . . , 'CS7<0:7>'. Here, the trimming unit 340 can modify a voltage value by trimming voltage output corresponding to a code value of a selected trimming coding signal group.

As described above, the trimming coding signal groups can represent a plurality of variation signals '1UP', '2UP', . . . , '1DN', and '2DN'. Here, although not shown, a table can be provided for such a code value so that a predetermined intermediate level of the trimming coding signal group can be adopted as a base level. Accordingly, if the code value is gradually increased from the base level, then an increase signal, such as '1UP', '2UP' or '3UP', can be output. However, if the code value is gradually decreased from the base level, a decrease signal, such as '1DN' or '2DN', can be output. For example, the increase signals '1UP', '2UP' or '3UP' can represent voltages increased from the base voltage level by about 0.025V.

Figure 9:
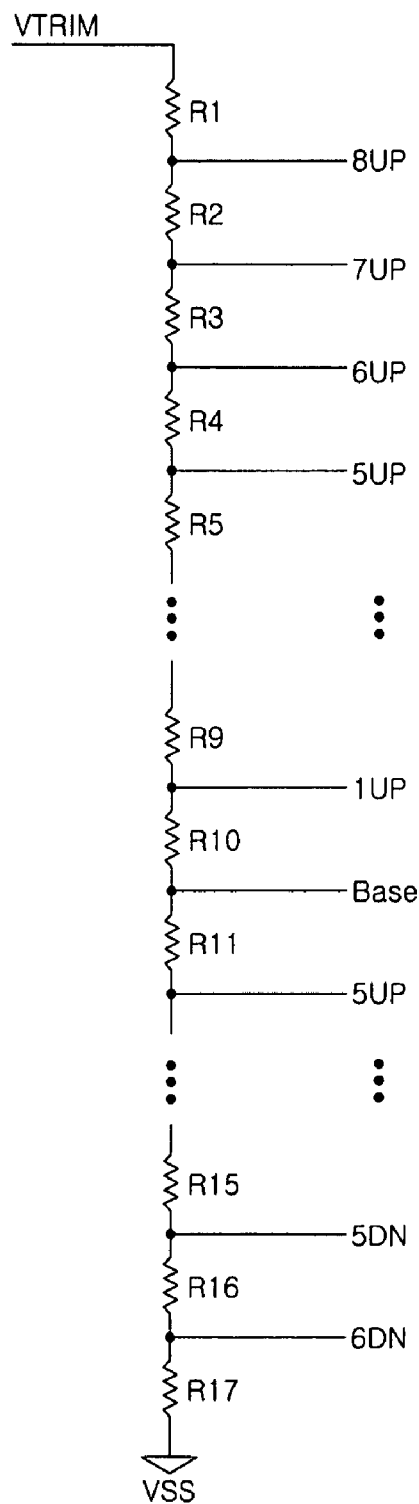
FIG. 9 is a schematic circuit diagram of an exemplary trimming unit capable of being implemented in the generator of FIG. 8 according to one embodiment.

FIG. 9 is a schematic circuit diagram of an exemplary trimming unit capable of being implemented in the generator of FIG. 8 according to one embodiment. In FIG. 9, the trimming unit 340 can include a plurality of resistors R1 to R17, thereby providing the trimming voltage VTRIM corresponding to a variation signal based on a predetermined code value. For example, if an activated code value of the selected trimming coding signal group represents a '7UP' signal, then voltage of a node corresponding to the '7UP' signal can be output as the trimming voltage VTRIM.

In FIG. 9, since the trimming unit 340 is for illustrative purposes only, the number of resistors, a base level corresponding to a selected fuse set, and configuration of a variation signal can be modified.

As described above, the semiconductor memory apparatus can reflect the fuse cutting state in the wafer level when performing the trimming in the package level. Accordingly, when a code value for a trimming code is received by the test mode signals 'TM0' to 'TM2', the base level can vary depending on the fuse cutting stat in the wafer level. However, when various trimming target internal voltage exist, each circuit must include a plurality of decoding circuits for generating a trimming code. Thus, an area efficiency of the circuit may be degraded.

Next, an exemplary fuse cutting state in the wafer level when performing the trimming operation in the package level will be explained with reference to FIG. 10. For purposes of brevity, hereinafter only exemplary differences between the trimming circuits 10 of FIGS. 1-9 and FIGS. 10-16 will be described in order to avoid redundancy.

Figure 10:
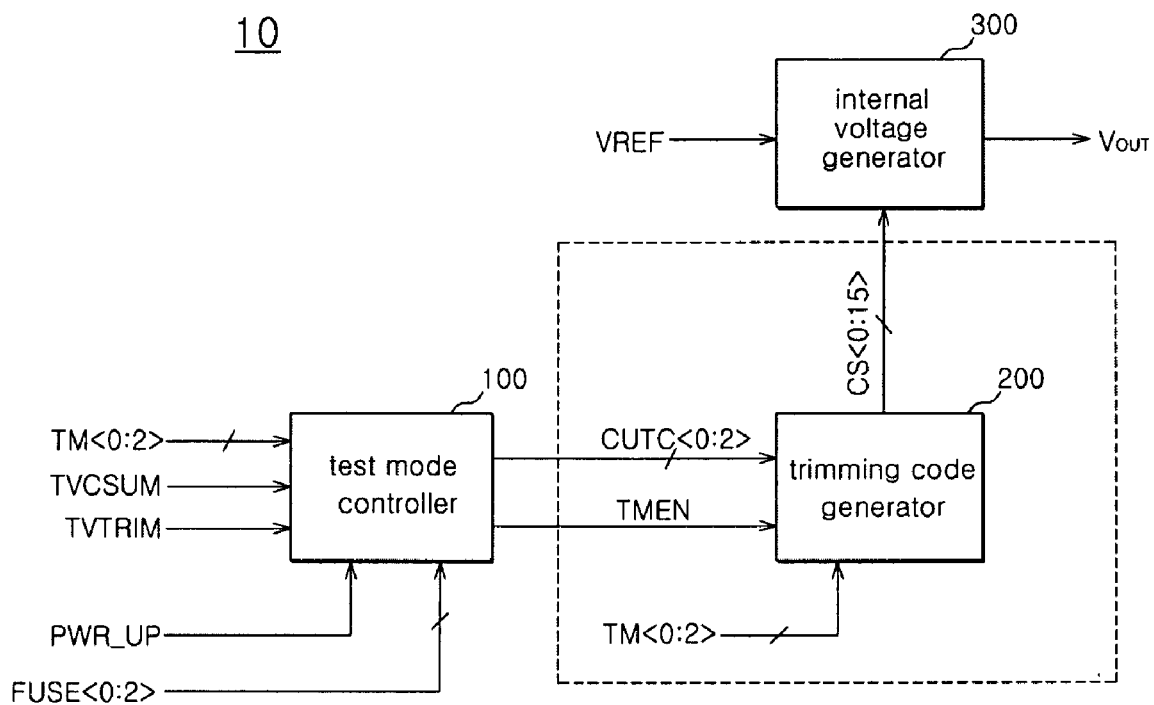
FIG. 10 is a schematic block diagram of another exemplary trimming circuit of a semiconductor memory apparatus according to another embodiment.

FIG. 10 is a block diagram of a trimming circuit of a semiconductor memory apparatus configured in accordance with another embodiment. In FIG. 10, the trimming circuit can be configured to include the test mode controller 100, the trimming code generator 200 and the internal voltage generator 300.

The trimming code generator 200 can be configured to generate trimming coding signal groups 'CS<0:15>' for a test mode in response to a trimming base enable signal 'TMEN', the trimming information signals 'CUTC<0:2>' and the test mode signals 'TM<0:2>'. The trimming code generator 200 can output the trimming coding signal groups 'CS<0:15>' in response to the trimming base enable signal 'TMEN'.

Figure 11:
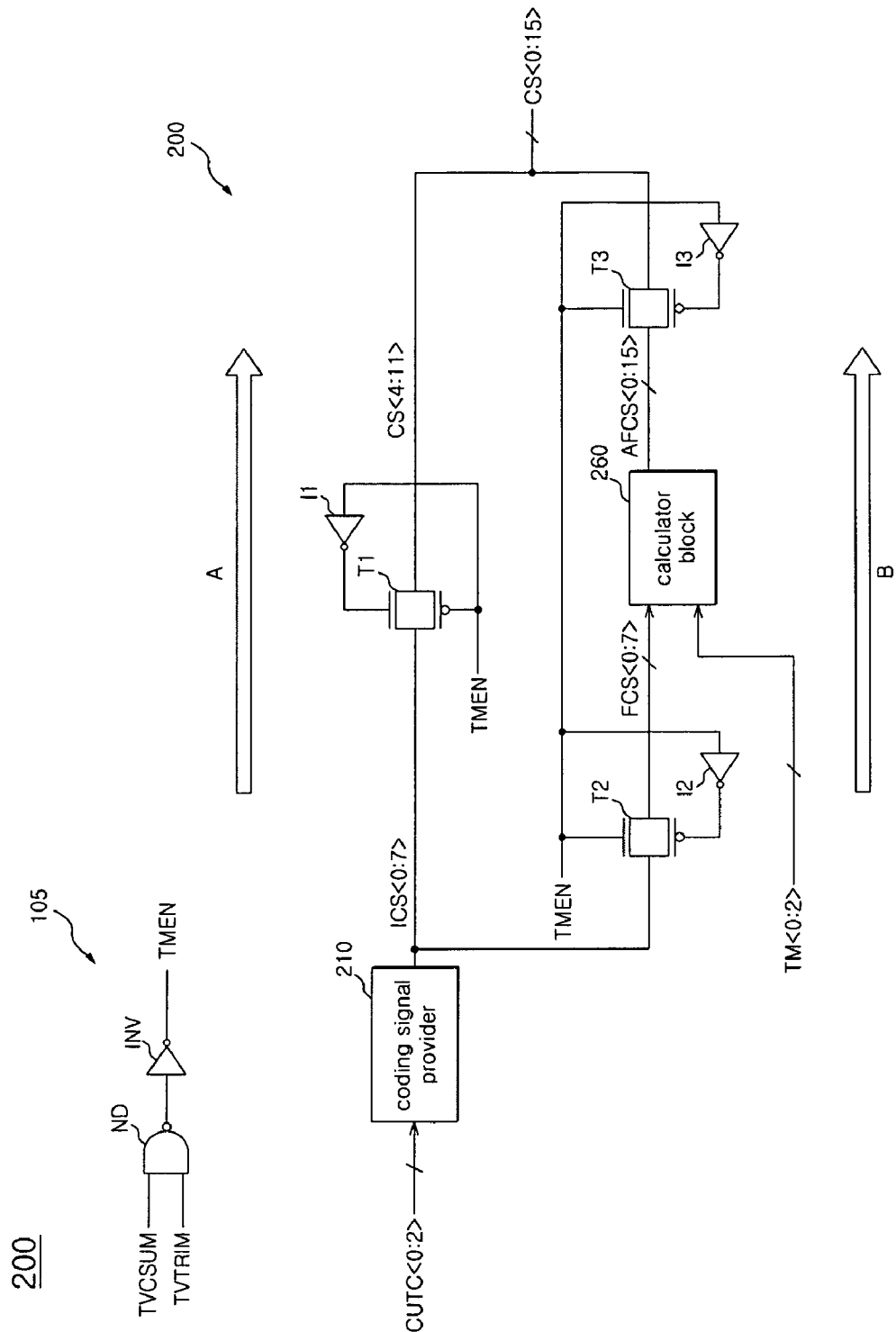
FIG. 11 is a schematic block diagram of an exemplary trimming code generator capable of being implemented in the circuit of FIG. 10 according to one embodiment.

FIG. 11 is a schematic block diagram of an exemplary trimming code generator capable of being implemented in the circuit of FIG. 10 according to one embodiment. In FIG. 11, a trimming base enable signal generator 105 can be configured to generate the trimming base enable signal 'TMEN' having a low level in response to a low level of the trimming target voltage flag signal 'TVCSUM' or the trimming flag signal 'TVTRIM'.

Here, the trimming code generator 200 can include a coding signal provider 210 and a calculator block 260.

In contrast to the fuse set selector 220 for providing a plurality of fuse set selection signals (in FIG. 5) and the decoding block 240 for decoding the output signal of the fuse set selector 220 (in FIG. 5), the trimming code generator 200 of FIG. 11 can include the coding signal provider 210 having a simplified structure and the calculator block 260 for performing subtraction and addition operations.

In FIG. 11, the coding signal provider 210 can be configured to provide first eight decoding signal groups 'ICS<0:7>' by coding received first to third trimming information signals 'CUTC0' to 'CUTC2'. The coding signal provider 210 can include a decoder that can receive a 3-bit signal to provide an 8-bit signal.

In addition, the trimming code generator 200 can include a plurality of transfer gates T1 to T3. Here, for example, the transfer gates T1 to T3 can be turned ON or OFF in response to the trimming base enable signal 'TMEN'.

An exemplary case in which the trimming target voltage flag signal 'TVCSUM' is at a high level and the trimming flag signal 'TVTRIM' is at a low level in order to trim corresponding trimming voltage will be described.

In FIG. 11, the first transfer gate T1 can be turned ON in response to the trimming base enable signal 'TMEN' having a low level to transfer the first decoding signal groups 'ICS<0:7>' as the trimming coding signal groups 'CS<4:11>'. Here, for example, the trimming coding signal groups 'CS<4:11>' can exist at a center position of code values of the expanded trimming coding signal groups 'CS<0:15>'. For example, when the trimming flag signal 'TVTRIM' is at the low level, decoding signals of the first to third trimming information signals 'CUTC0' to 'CUTC2' can be provided as the trimming coding signal groups 'CS<4:11>' through a path (A) of a normal signal.

Next, an exemplary case in which the trimming target voltage flag signal 'TVCSUM' and the trimming flag signal 'TVTRIM' are at a high level will be described.

In FIG. 11, the second and third transfer gates T2 and T3 can be turned ON in response to the trimming base enable signal 'TMEN' having a high level, so that fuse coding signals 'FCS<0:7>' can be output as the first decoding signal groups 'ICS<0:7>'. For example, the first decoding signal groups 'ICS<0:7>' and the fuse coding signals 'FCS<0:7>' can have substantially the same level, even though they have names different from each other. Here, the test mode signals 'TM<0:2>' can be provided as a code variation information signal.

Then, the calculator block 260 can be configured to receive the fuse coding signals 'FCS<0:7>' and change the code value by increasing/decreasing the code value according to the test mode signals 'TM<0:2>', thereby providing calculated fuse coding signals 'AFCS<0:15>' as the expanded trimming coding signal groups 'CS<0:15>' through a signal path (B). As described above, one calculator block 260 can directly add or subtract a trimming code value on the basis of the fuse cutting information in the wafer level.

Figure 12:
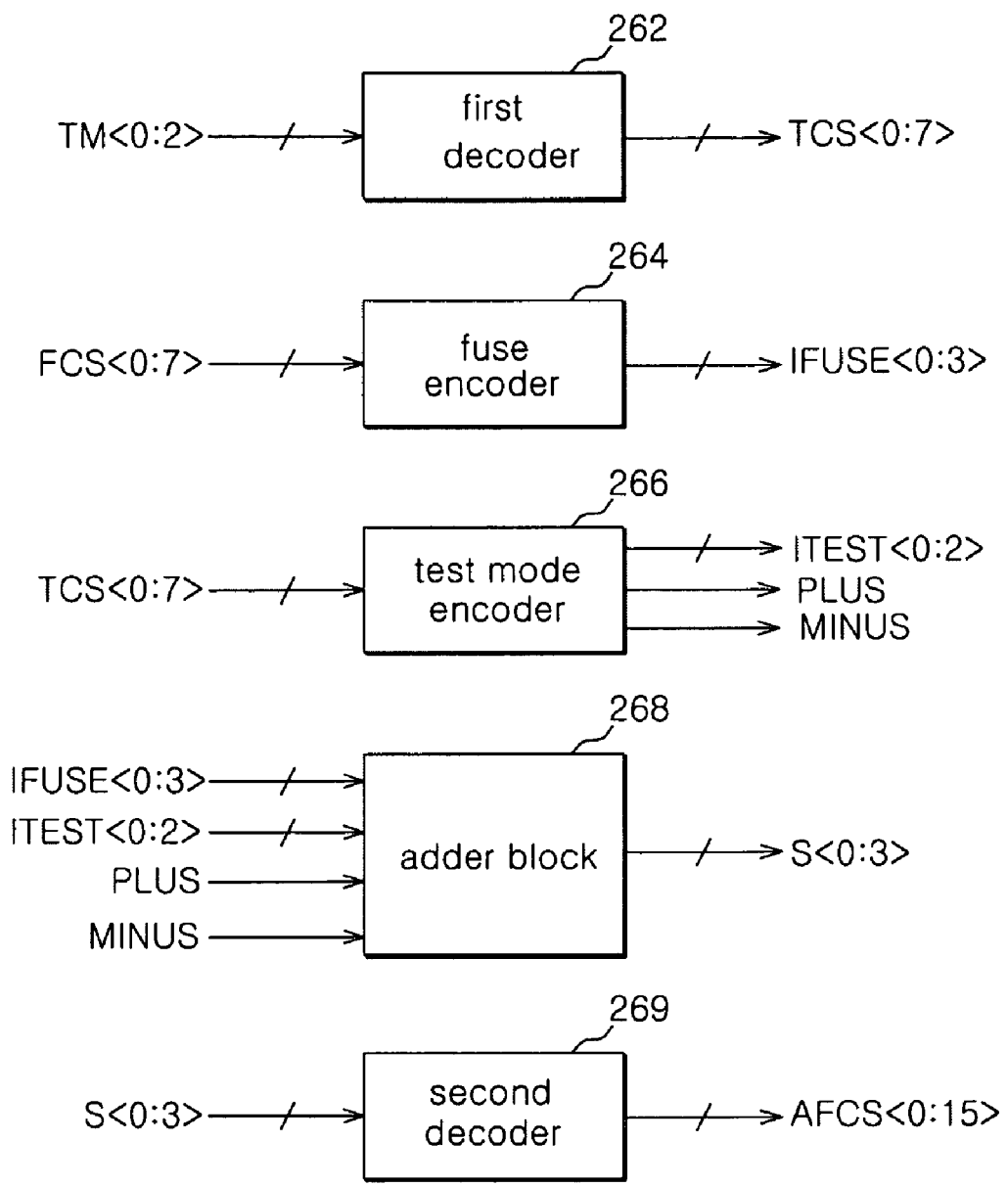
FIG. 12 is a schematic block diagram of an exemplary calculator block capable of being implemented in the generator of FIG. 11 according to one embodiment.

FIG. 12 is a schematic block diagram of an exemplary calculator block capable of being implemented in the generator of FIG. 11 according to one embodiment. In FIG. 12, the calculator block 260 can be configured to include a first decoder 262, a fuse encoder 264, a test mode encoder 266, an adder block 268 and a second decoder 269.

The first decoder 262 can be configured to provide operation coding signals 'TCS<0:7>' by decoding the first to third test mode signals 'TM<0:2>'. The fuse encoder 264 can be configured to provide fuse encoding signals 'IFUSE<0:3>' by encoding the fuse coding signals 'FCS<0:7>'. The test mode encoder 266 can be configured to receive the operation coding signals 'TCS<0:7>' to provide addition and subtraction control signals 'ITEST<0:2>', an addition flag signal 'PLUS', and a subtraction flag signal 'MINUS'.

In addition, the adder block 268 can be configured to perform an addition or subtraction operation in response to the fuse encoding signals 'IFUSE<0:3>', the addition and subtraction control signals 'ITEST<0:2>', the addition flag signal 'PLUS', and the subtraction flag signal 'MINUS'. For example, the adder block 268 can be configured as an adder, and can be configured to perform a subtraction operation.

The second decoder 269 can be configured to provide the calculated fuse coding signals 'AFCS<0:15>' by decoding an output result of the adder block 268. Although not shown, the first and second decoders 262 and 269 can include a decoder.

Figure 13:
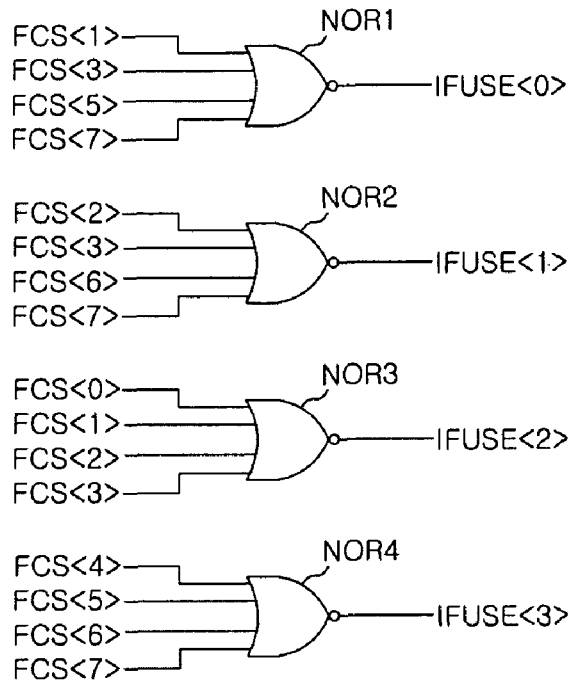
FIG. 13 is a schematic circuit diagram of an exemplary fuse encoder capable of being implemented in the block of FIG. 12 according to one embodiment.

FIG. 13 is a schematic circuit diagram of an exemplary fuse encoder capable of being implemented in the block of FIG. 12 according to one embodiment. In FIG. 13, the fuse encoder 264 can be configured to include four NOR gates NOR1 to NOR 4 that receive the fuse coding signals 'FCS<0:7>'.

The first NOR gate NOR1 can be configured to provide the first fuse encoding signal 'IFUSE<0>' by NORing the second, fourth, sixth, and eighth fuse coding signals 'FCS<1>', 'FCS<3>', 'FCS<5>' and 'FCS<7>'. The second NOR gate NOR2 can be configured to provide the second fuse encoding signal IFUSE<1> by NORing the third, fourth, seventh, and eighth fuse coding signals 'FCS<2>', 'FCS<3>', 'FCS<6>' and 'FCS<7>'. The third NOR gate NOR1 can be configured to provide the third fuse encoding signal 'IFUSE<2>' by NORing the first to fourth fuse coding signals 'FCS<0:3>'. The fourth NOR gate NOR1 can be configured to provide the fourth fuse encoding signal 'IFUSE<3>' by NORing the fifth to eighth fuse coding signals 'FCS<4:7>'.

These encoding operations using the fuse coding signals 'FCS<0:7>' is merely exemplary. Accordingly, combinations of the coding signals can vary depending on the configuration of the fuse encoder 264.

Table 1 represents fuse encoding relation based on the exemplary encoding operations of the fuse encoder of FIG. 13.

TABLE 1

| IFUSE<3> | IFUSE<2> | IFUSE<1> | IFUSE<0> | FCS<i> | CS<i> |
|---|---|---|---|---|---|
| 1 | 1 | 1 | 1 | | CS<15> |
| 1 | 1 | 1 | 0 | | CS<14> |
| 1 | 1 | 0 | 1 | | CS<13> |
| 1 | 1 | 0 | 0 | | CS<12> |
| 1 | 0 | 1 | 1 | 0 | CS<11> |
| 1 | 0 | 1 | 0 | 1 | CS<10> |
| 1 | 0 | 0 | 1 | 2 | CS<9> |
| 1 | 0 | 0 | 0 | 3 | CS<8> |

TABLE 1-continued

| IFUSE<3> | IFUSE<2> | IFUSE<1> | IFUSE<0> | FCS<i> | CS<i> |
|---|---|---|---|---|---|
| 0 | 1 | 1 | 1 | 4 | CS<7> |
| 0 | 1 | 1 | 0 | 5 | CS<6> |
| 0 | 1 | 0 | 1 | 6 | CS<5> |
| 0 | 1 | 0 | 0 | 7 | CS<4> |
| 0 | 0 | 1 | 1 | | CS<3> |
| 0 | 0 | 1 | 0 | | CS<2> |
| 0 | 0 | 0 | 1 | | CS<1> |
| 0 | 0 | 0 | 0 | | CS<0> |

As expressed by Table 1 above, the fuse coding signals 'FCS<0:7>' can be set to center code values of the expanded trimming coding signal groups 'CS<0:15>'. For example, as described in FIG. 11, the fuse coding signals 'FCS<0:7>' can be set to the code values of 'CS<4:11>' positioned at the center of the expanded trimming coding signal groups 'CS<0:15>'. Accordingly, a decoding range of an output signal can be ensured when an addition or subtraction operation is performed using the first to fourth fuse encoding signals 'IFUSE<0:3>' obtained by encoding the fuse coding signals 'FCS<0:7>'.

Figure 14:
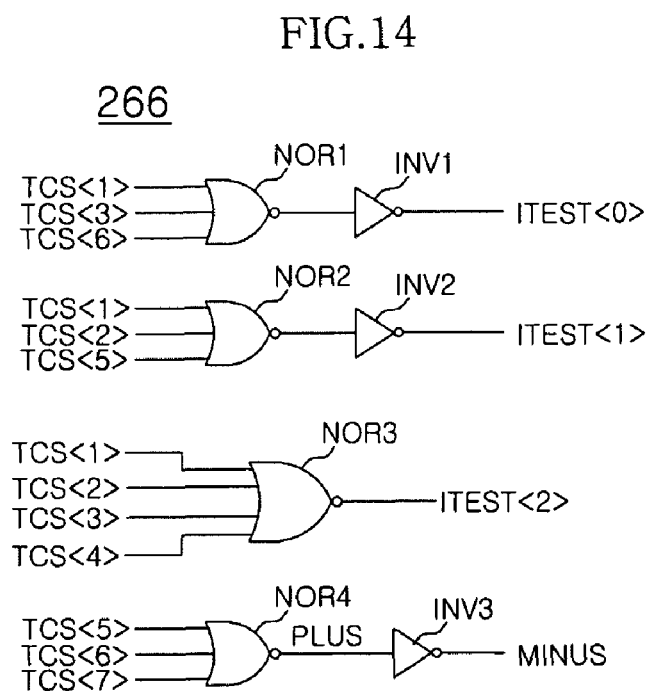
FIG. 14 is a schematic circuit diagram of an exemplary test mode encoder capable of being implemented in the block of FIG. 12 according to one embodiment.

FIG. 14 is a schematic circuit diagram of an exemplary test mode encoder capable of being implemented in the block of FIG. 12 according to one embodiment. In FIG. 14, the test mode encoder 266 can generate various adder control signals using the operation coding signals 'TCS<0:7>'. For example, the test mode encoder 266 can be configured to include first to fourth NOR gates NOR1 to NOR4 and first to third inverters INV1 to INV3.

The first NOR gate NOR1 can be configured to perform a NOR operation relative to the second, fourth, and seventh operation coding signals 'TCS<1>', 'TCS<3>' and 'TCS<6>'. In addition, a first inverter INV1 can be configured to invert an output signal of the first NOR gate NOR1 to provide the first addition and subtraction control signal 'ITEST<0>'.

Since a process of performing an encoding operating using the operation coding signals 'TCS<0:7>' can be similar to that detailed above, except for combinations of received signals, detailed description thereof will be omitted in order to avoid redundancy.

In FIG. 14, the test mode encoder 266 can provide a flag signal representing addition or subtraction in addition to the addition and subtraction control signals 'ITEST<0:2>'. For example, the fourth NOR gate NOR4 can be configured to perform a NOR operation relative to the sixth to eighth operation coding signals 'TCS<5:7>' to provide the addition flag signal 'PLUS'. Furthermore, the third inverter INV3 can be configured to invert an output signal of the fourth NOR gate NOR4 to provide the subtraction flag signal 'MINUS'.

Table 2 below represents exemplary addition and subtraction control signals 'ITEST<0:2>' based on the test mode encoder 266 of FIG. 14.

TABLE 2

| ITEST<2> | ITEST<1> | ITEST<0> | TCS<i> | NOTE |
|---|---|---|---|---|
| 1 | 0 | 0 | 0 | +4Up |
| 0 | 1 | 1 | 1 | +3Up |
| 0 | 1 | 0 | 2 | +2Up |
| 0 | 0 | 1 | 3 | +1Up |
| 0 | 0 | 0 | 4 | Base |
| 1 | 1 | 0 | 5 | −1Dn |
| 1 | 0 | 1 | 6 | −2Dn |
| 1 | 0 | 0 | 7 | −3Dn |

Code values when the addition and subtraction control signals 'ITEST<0:2>' having a low level can be set to a base level. Further, if code values of the addition and subtraction control signals 'ITEST<0:2>' are --001--, then the code value can be set to 1UP information. If the code values of the addition and subtraction control signals 'ITEST<0:2>' are --010--, then the code value can be set to 2UP information. Similarly, if the code values of the addition and subtraction control signals 'ITEST<0:2>' are --110--, then the code value can be set to 1DN information. If the code values of the addition and subtraction control signals 'ITEST<0:2>' are --101--, the code value can be set to 2DN information. Particularly, when a subtraction mode is established, the test mode encoder 266 can output the addition and subtraction control signals 'ITEST<0:2>' by reflecting subtraction degree and complementary information for subtraction. For example, if the addition and subtraction control signals 'ITEST<0:2>' of 3DN information are --100--, then a complement for a binary bit --001-- corresponding to a decimal number 3 is --100--. Thus, the adder block 268 can directly calculate a trimming code value by using the addition and subtraction control signals having trimming size information and subtraction information.

As described above, the operation coding signals can be generated by decoding the test mode signals 'TM<0:2>', and then can be encoded to directly generate control signals representing subtraction size, addition size, and subtraction information and addition information without using an additional decoding circuit. For example, the various exemplary decoding circuits can select another decoding circuit using information decoded by the decoding circuits and then perform a decoding operation, thereby selecting a code variation value of trimming target voltage. Accordingly, a plurality of decoding circuits can be provided to continuously perform a decoding operation relative to one target voltage. However, one adder block 268 can be used to increase/decrease a code value corresponding to received encoding signals, thereby obtaining desired addition or subtraction information. In addition, only different trimming code values or control signals can be generated according to each target voltage, and the common adder block 268 can be driven using the signals, so that the area efficiency of a circuit can be improved.

Figure 15:
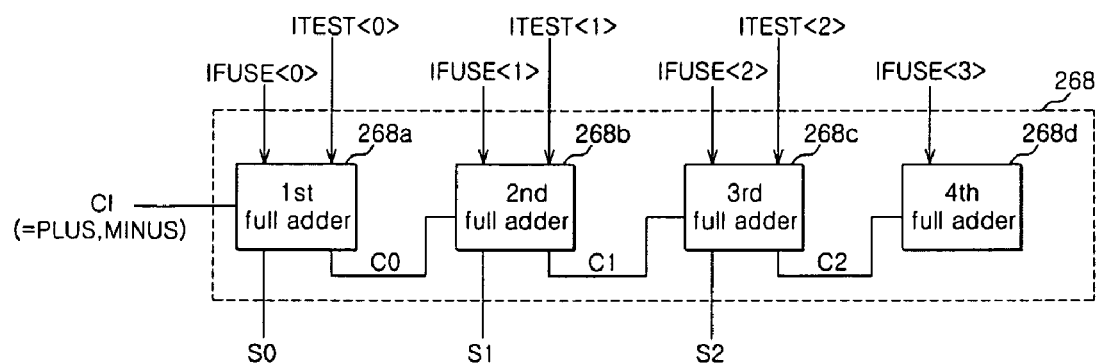
FIG. 15 is a schematic circuit diagram of an exemplary adder block capable of being implemented in the block of FIG. 12 according to one embodiment.

FIG. 15 is a schematic circuit diagram of an exemplary adder block capable of being implemented in the block of FIG. 12 according to one embodiment. In FIG. 15, the adder block 268 can include four full adders 268a to 268d.

The first full adder 268a can be configured to receive the first fuse encoding signal 'IFUSE<0>' and the first addition and subtraction control signals 'ITEST<0>' in response to an operation control signal 'CI' determining addition or subtraction, thereby providing a first operation result signal 'S0' and a first carry 'C0'.

The second full adder 268b can be configured to receive the first carry 'C0', the second fuse encoding signal 'IFUSE<1>' and the second addition and subtraction control signals 'ITEST<1>' to provide a second operation result signal 'S1' and a second carry 'C1'.

Since the third and fourth full adders 268d and 268d can have configurations substantially similar to that of the first full adder 268a, detailed description thereof will be omitted.

In FIG. 15, operations of the first to fourth 268a to 268d can be expressed using Boolean algebra, as follows.

In order to simply describe an equation, signal 'Ai' can be defined as 'IFUSE<i>', signal 'Bj' can be defined as 'ITEST<j>', signal 'CI' can be defined as 1 (for subtraction) and can be defined as 0 (for addition).

A first cipher can be obtained by exclusive-ORing the operation control signal 'CI' representing a subtraction or addition operation, 'A<0>' and 'B<0>'.

According to a subtraction operation using the adder 268, a complementary signal of a binary bit to be subtracted can be created and be subject to an addition operation, instead of the subtraction operation. In addition, a binary one bit can be additionally added, and a generated carry can be ignored.

Thus, following Equation 1 can be obtained.

$$S0 = CI\ \text{EXOR}\ A0\ \text{EXOR}\ B0$$

$$C0 = (CI\ \text{AND}\ A0)\ \text{OR}\ (A0\ \text{AND}\ B0)\ \text{OR}\ (B0\ \text{AND}\ CI) = A0\ \text{OR}\ (A0\ \text{AND}\ B0)\ \text{OR}\ B0 \qquad \text{Equation 1}$$

If (CI=1) is put into Equation 1 in the subtraction operation, then S0=(A0 EXOR B0). If (CI=0) is put into Equation 1 in the addition operation, then S0=A0 EXOR B0.

Further, if (CI=1) is put into Equation 1 in the subtraction operation, then C0=A0 OR B0. If (CI=0) is put into Equation 1 in the addition operation, then C0=A0 AND B0.

A second cipher can be obtained by exclusive-ORing the generated carry signal, 'A<1>' and 'B<1>'. Furthermore, a second carry 'C1' can be provided by exclusive-ORing the first carry 'C0' and each input signal to be operated.

Thus, the following Equation 2, 3, and 4 can be obtained.

$$S1 = C0\ \text{EXOR}\ A1\ \text{EXOR}\ B1$$

$$C1 = (C0\ \text{AND}\ A1)\ \text{OR}\ (A1\ \text{AND}\ B1)\ \text{OR}\ (B1\ \text{AND}\ C0) \qquad \text{Equation 2}$$

$$S2 = C1\ \text{EXOR}\ A2\ \text{EXOR}\ B2$$

$$C2 = (C1\ \text{AND}\ A2)\ \text{OR}\ (A2\ \text{AND}\ B2)\ \text{OR}\ (B2\ \text{AND}\ C1) \qquad \text{Equation 3}$$

$$S3 = (C2\ \text{EXOR}\ A3)';\ \text{subtraction operation}$$

$$S3 = C2\ \text{EXOR}\ A3;\ \text{addition operation} \qquad \text{Equation 4}$$

Accordingly, the adder block 268 can be realized in a circuit by using such Boolean algebra.

Figure 16A:
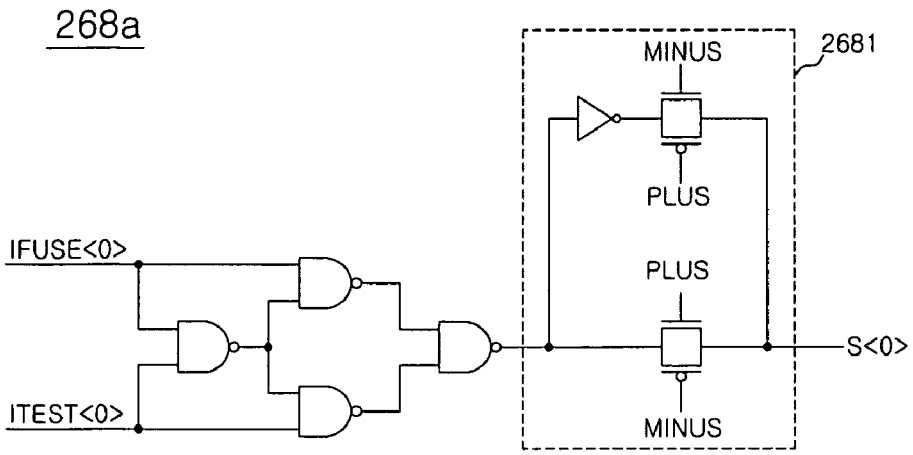
FIGS. 16A to 16D are schematic diagrams of various exemplary circuits of the adder block of FIG. 15 according to different embodiments.
Figure 16B:
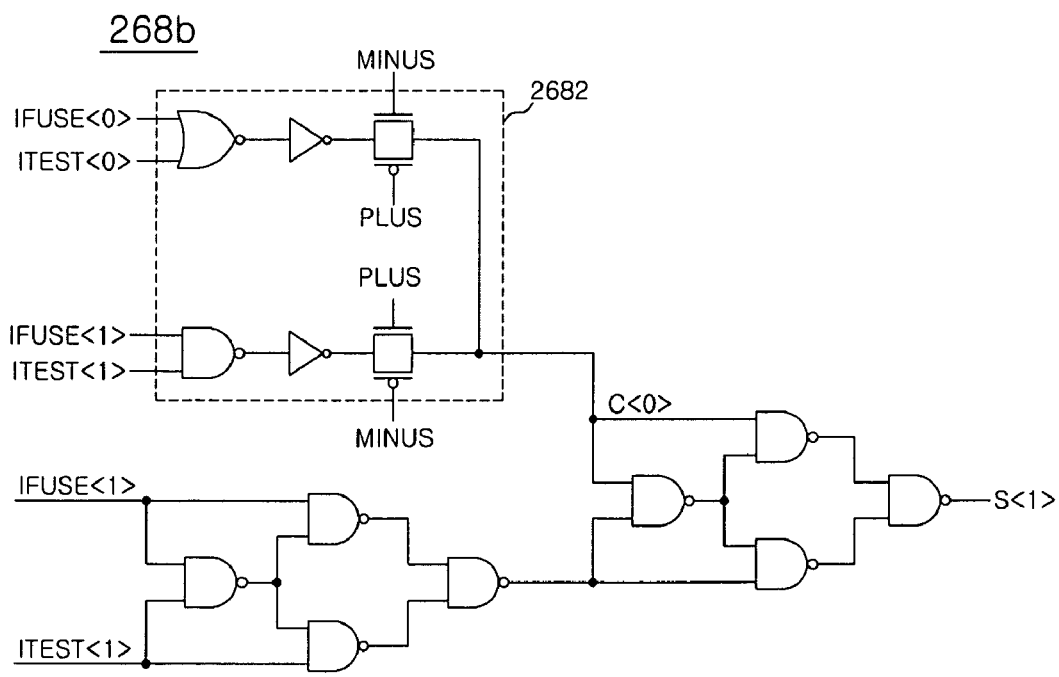
Figure 16C:
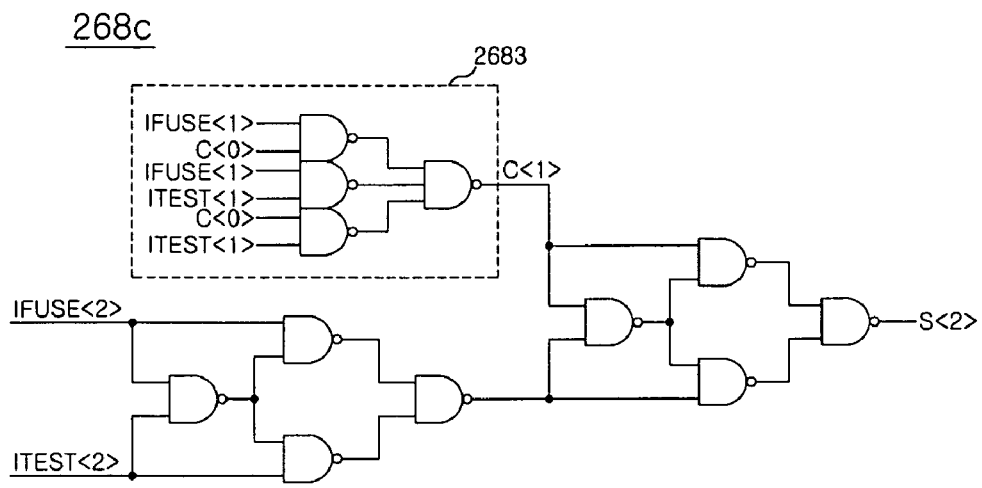
Figure 16D:
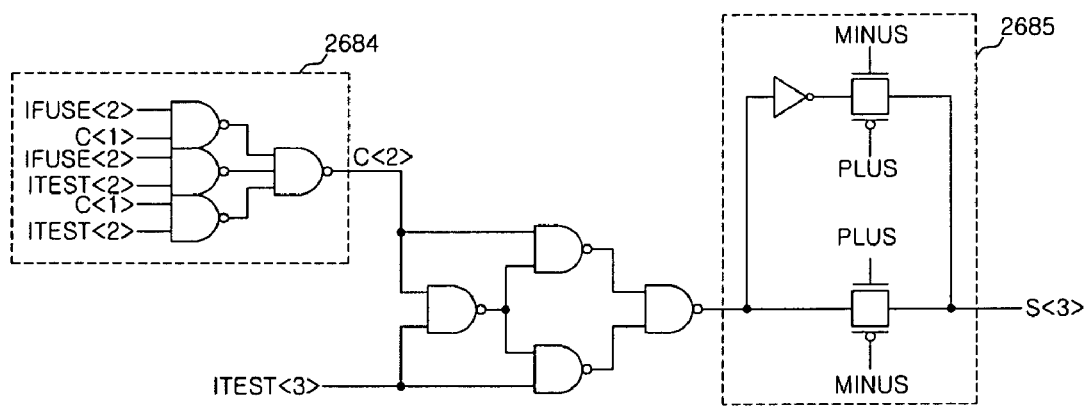

FIGS. 16A to 16D are schematic diagrams of various exemplary circuits of the adder block of FIG. 15 according to different embodiments. Here, FIG. 16A shows the first full adder 268a for the first cipher operation, FIG. 16B shows the second full adder 268b for the second cipher operation, FIG. 16C shows the third full adder 268c for the third cipher operation, and FIG. 16D shows the fourth full adder 268d for the fourth cipher operation. Since the first to fourth full adders 268a to 268d can be realized using logic levels, only characteristics in accordance with other embodiments will be described.

In, FIG. 16A an operation controller 2681 can determine whether to take a complement using the addition or subtraction flag 'PLUS' or 'MINUS', or to perform an exclusive operation. For example, the operation controller 2681 can be configured to perform an exclusive-OR operation relative to the first fuse encoding signal 'IFUSE<0>' and the first addition and subtraction control signal 'ITEST<0>' to determine inversion by the addition or subtraction flag signals 'PLUS' or 'MINUS', thereby providing the first operation result signal 'S0'.

In FIG. 16B, in the second cipher operation, the first carry 'C0', the second fuse encoding signal 'IFUSE<1>', and the second addition and subtraction control signal 'ITEST<1>' can be exclusive-ORed to provide the second operation result signal 'S1'. In addition, a first carry generator 2682 can be provided in an input unit of the second full adder 268b.

Furthermore, the first carry generator 2682 can be provided in the first full adder 268a. For example, the first carry generator 2682 can be configured to perform an OR operation relative to the first fuse encoding signal 'IFUSE<0>' and the first addition and subtraction control signal 'ITEST<0>' in the addition operation, and perform an AND operation relative to the first fuse encoding signal 'IFUSE<0>' and the first addition and subtraction control signal 'ITEST<0>' in the subtraction operation.

In FIG. 16C, in the third cipher operation, the second carry 'C1', the third fuse encoding signal 'IFUSE<2>', and the third addition and subtraction control signal 'ITEST<2>' can be exclusive-ORed to provide the third operation result signal 'S2'. In addition, a second carry generator 2683 can be provided in an input unit of the third full adder 268c. Furthermore, the second carry generator 2683 can be provided in the second full adder 268b. For example, the second carry generator 2683 can be configured to perform an AND operation relative to the first carry 'C0' and the second fuse encoding signal 'IFUSE<1>', the second fuse encoding signal 'IFUSE<1>' and the second addition and subtraction control signal 'ITEST<1>', the first carry 'C0' and the second addition and subtraction control signal 'ITEST<1>', respectively, and can then perform an OR operation relative to results of the AND operations, thereby providing the second carry 'C1'.

In FIG. 16D, in the fourth cipher operation, the fourth fuse encoding signal IFUSE<3> and the third carry 'C2' can be exclusive-ORed. Here, inversion can be determined by the addition or subtraction flag signals 'PLUS' or 'MINUS', thereby providing the fourth operation result signal S3. In addition, the fourth full adder 268d can include an operation controller 2685 to determine whether to take a complement using the addition or subtraction flag signals 'PLUS' or 'MINUS', or to perform an exclusive operation. Furthermore, a third carry generator 2684 can be configured to perform an AND operation relative to the second carry 'C1' and the third fuse encoding signal 'IFUSE<2>', the third fuse encoding signal IFUSE<2> and the third addition and subtraction control signal 'ITEST<2>', the second carry 'C1' and the third addition and subtraction control signal 'ITEST<2>', respectively, and can then perform an OR operation relative to results of the AND operations, thereby providing the third carry 'C2'. Then, the resulting signals can be decoded by the second decoder 269 (in FIG. 12) to be provided as a signal that determines an output node having trimmed voltage.

An exemplary operation of the semiconductor memory apparatus will be described with reference to FIGS. 10-16.

For example, a case will be described, in which fuse cutting information in the wafer level is reflected in the package level, and then the trimming is performed according to a trimming code signal in the test mode.

When fuse signals 'FUSE<2:0>' are --001--, the first to third trimming information signals 'CUTC0' to 'CUTC2' can also be provided as --001--, and thus, the ICS<3> can be activated by the coding signal provider 210. Accordingly, the fuse coding signal 'FCS<3>' can be activated and the fuse signals 'IFUSE<3:0>' encoded by the fuse encoder 264 can become --1000--. Then, in order to perform trimming representing decrease of a predetermined level (e.g. 2DN), combination of the test mode signals 'TM<2:0>' can be input as --110--. Here, the operation coding signal 'TCS<6>' can be activated by the first decoder 262. Next, the activated operation coding signal 'TCS<6>' can be encoded by the test mode encoder 266 so that the addition and subtraction control signals 'ITEST<2:0>' can become --101--, and simultaneously the subtraction flag 'MINUS' can be activated. Referring to Table 2, the addition and subtraction control signal --101-- refers to the '2DN'.

Next, the fuse encoding signals 'IFUSE<3:0>' of --1000--, the addition and subtraction control signals 'ITEST<2:0>' of --101--, and the subtraction flag signal 'MINUS' can be provided to the adder block 268.

Referring to the circuit diagram of the adder block 268, in the case of the first cipher operation, since the input signal 'IFUSE<0>' is --0-- and the input signal 'ITEST<0>' is --1--, the first operation result signal 'S0' is --0--. Furthermore, the first carry 'C0' is -1-- by ORing the IFUSE<0> of --0-- and the 'ITEST<0>' of --1--.

In the case of the second cipher operation, since the 'IFUSE<1>' is --0-- and the 'ITEST<1>' is --0--, the second operation result signal 'S1' is --1-- and the second carry 'C1' is --0--.

In the case of the third cipher operation, since the 'IFUSE<2>' is --0-- and the 'ITEST<2>' is --1--, the third operation result signal 'S2' is --1-- and the third carry 'C2' is --0--.

In the case of the last cipher operation, since the 'IFUSE<3>' is --1-- and the third carry 'C2' is --0--, the fourth operation result signal 'S3' is --0--.

Thus, the final operation result signals 'S<3:0>' are --0110--.

Here, subtracting --010-- (corresponds to a decimal number 2) to be trimmed from the fuse encoding signals 'IFUSE<3:0>' of --1000-- can be expressed by an addition Equation 5 of a binary bit below.

$$\text{'1000'}+\text{'1101'}+\text{'0001'} \quad \text{Equation 5}$$

The result of Equation 5 is identical to the output result of the adder block 268 since, when a subtraction test mode is established, the test mode encoder 266 can convert the subtraction test mode to the addition and subtraction control signal by using a complement as described above.

If the fuse encoding signals 'IFUSE<3:0>' is decoded by the second decoder 269, the 'AFCS<6>' can be activated and the expanded trimming code signal 'CS<6>' can be provided, so that voltage can be trimmed by a desired level.

Figure 17:
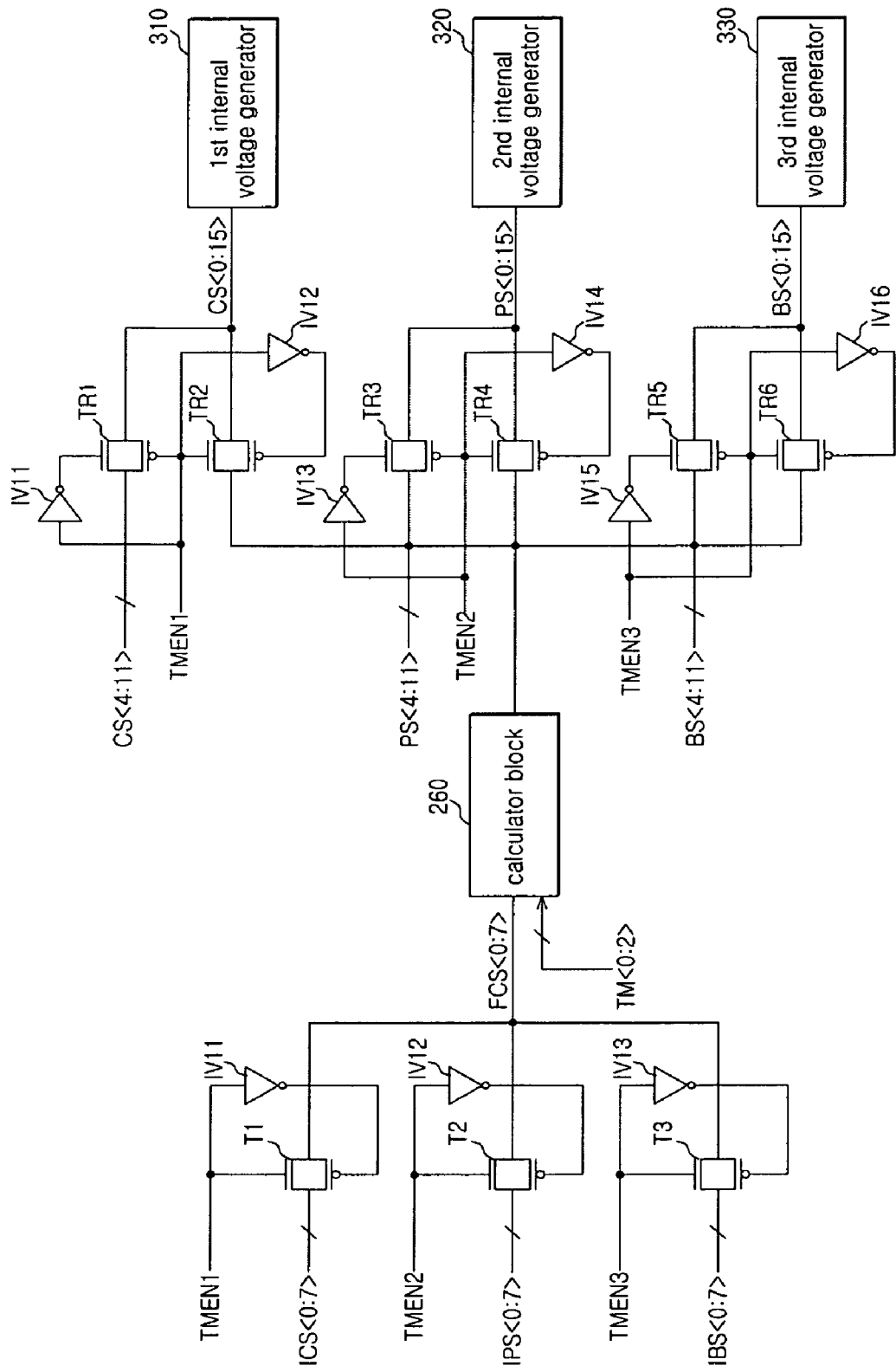
FIG. 17 is a schematic block diagram of another exemplary trimming circuit of a semiconductor memory apparatus according to another embodiment.

FIG. 17 is a schematic block diagram of another exemplary trimming circuit of a semiconductor memory apparatus according to another embodiment. FIG. 17 shows a case in which various trimming target internal voltage exist.

In FIG. 17, various control signals can be added to control each internal voltage, wherein only one calculator block 260 is provided.

Although not shown, the test mode controller 100 (in FIG. 10) can be configured to provide the first to third trimming base enable signals 'TMEN1' to 'TMEN3' serving as voltage control signals corresponding to each target voltage. For example, the test mode control 100 can provide the first to third trimming base enable signals 'TMEN1' to 'TMEN3' by using the trimming flag signal 'TVTRIM' and the flag signal 'TVCSUM' representing each target voltage (in FIG. 11).

In addition, a plurality of coding signal providers 210 (in FIG. 11) can be provided to output first to third operation coding signals 'ICS<0:7>', 'IPS<0:7>' and 'IBS<0:7>' according to fuse cutting information corresponding to various target voltage.

Then, the transfer gates T1 to T3 can be selectively turned ON according to levels of the first to third trimming base enable signals 'TMEN1' to 'TMEN3' that control a signal path of each target voltage. Accordingly, the first to third operation coding signals 'ICS<0:7>', 'IPS<0:7>' and 'IBS<0:7>' can be recognized as the fuse coding signals 'FCS<0:7>', and then can be provided as trimming codes 'CS<0:15>', 'PS<0:15>' and 'BS<0:15>' calculated through the calculator block 260. The trimming codes 'CS<0:15>', 'PS<0:15>' and 'BS<0:15>' can be provided to first to third internal voltage generators 310, 320 and 330 via second, fourth and sixth transfer gates TR2, TR4 and TR6 in response to the first to third trimming base enable signals 'TMEN1' to 'TMEN3'. For example, the first internal voltage generator 310 can generate core voltage VCORE, the second internal voltage generator 320 can generate high voltage VPP, and the third internal voltage generator 330 can generate substrate bias voltage VBB. The first to third trimming base enable signals 'TMEN1' to 'TMEN3' are not activated at the same time. Further, a cutting state and a code value vary depending on levels of each trimming target voltage.

Accordingly, if a plurality of trimming target voltages exist, various decoding circuits can be provided corresponding to each voltage. However, one common calculator block 260 can be configured to increase/decrease a trimming code value of the target voltage. Accordingly, the calculated trimming codes 'CS<0:15>', 'PS<0:15>' and 'BS<0:15>' capable of trimming the target voltage can be provided according to the first to third trimming base enable signals 'TMEN1' to 'TMEN3' that control signal paths of the first to third internal voltage generators 310, 320 and 330. Thus, the efficiency of an area can be improved.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A trimming circuit for a semiconductor memory apparatus, comprising:
    a trimming code generator configured to provide a trimming code signal group by performing one of addition and subtraction using a test mode signal and a fuse coding signal; and
    an internal voltage generator configured to provide trimmed voltage in response to the trimming code signal group as output voltage, wherein
    the trimming code generator is configured
        to generate an addition and subtraction control signal having a plurality of bits, an addition flag signal, and a subtraction flag signal by using the test mode signal, and
        to perform an addition operation using the fuse coding signal, the addition and subtraction control signal, the addition flag signal, and the subtraction flag signal.

2. The trimming circuit as claimed in claim 1, wherein the trimming code generator includes:
    a coding signal provider configured to provide the fuse coding signal by decoding fuse cutting information in a wafer level; and
    a calculator block configured to perform a subtraction operation using the fuse coding signal in response to the test mode signal serving as a code variation information signal.

3. The trimming circuit as claimed in claim 2, wherein the calculator block includes:
    a first decoder configured to decode the test mode signal;
    a fuse encoder configured to provide a fuse encoding signal having the plurality of bits by encoding the fuse coding signal;
    a test mode encoder configured to provide the addition and subtraction control signal having the plurality of bits, the addition flag signal, and the subtraction flag signal by encoding an output signal of the first decoder;
    an adder block configured to perform an addition operation relative to the fuse encoding signal, the addition and subtraction control signal, the addition flag signal, and the subtraction flag signal; and
    a second decoder configured to provide the trimming code signal group by decoding an output signal of the adder block.

4. The trimming circuit as claimed in claim 3, wherein the fuse encoder is configured to provide the addition and subtraction control signal having one of addition information and subtraction information, and information on addition and subtraction degree.

5. The trimming circuit as claimed in claim 4, wherein the fuse encoder is configured to provide code information on desired subtraction as the addition and subtraction control signal by using a complementary signal of a binary bit.

6. The trimming circuit as claimed in claim 3, wherein the adder block includes a plurality of adders for receiving the fuse encoding signal and the addition and subtraction control signal, and for providing an operation result and a carry signal according to each of the plurality of bits.

7. The trimming circuit as claimed in claim 1, wherein the trimming code generator provides the trimming code signal group directly to the internal voltage generator by performing one of addition and subtraction using the fuse coding signal and the test mode signal.

8. A trimming circuit for a semiconductor memory apparatus, comprising:
    a trimming code generator configured to provide a trimming code signal group according to a decoding result of the fuse cutting information in response to a trimming base enable signal that determines reception of the fuse cutting information in a wafer level, or provide the trimming code signal group after performing an operation relative to the decoding signal according to a test mode signal; and
    an internal voltage generator configured to provide voltage trimmed in response to the trimming code signal group as output voltage, wherein
    the trimming code generator is configured
        to generate an addition and subtraction control signal having a plurality of bits, an addition flag signal, and a subtraction flag signal by using the test mode signal, and
        to perform an addition operation using the fuse coding signal, the addition and subtraction control signal, the addition flag signal, and the subtraction flag signal.

9. The trimming circuit as claimed in claim 8, wherein the trimming code generator is configured to provide trimming code signals of the trimming code signal group based on a decoding result of the fuse cutting information if the trimming base enable signal is deactivated.

10. The trimming circuit as claimed in claim 9, wherein the trimming code generator is configured to provide the trimming code signal group as fuse coding signals that are obtained by performing one of an addition and subtraction operation relative to the decoding result of the fuse cutting information according to the test mode signal if the trimming base enable signal is activated.

11. The trimming circuit as claimed in claim 8, wherein the trimming code generator includes:
- a coding signal provider configured to provide the fuse coding signal by decoding the fuse cutting information; and
- a calculator block configured to perform addition and subtraction operations using the fuse coding signal in response to the test mode signal serving as a code variation information signal.

12. The trimming circuit as claimed in claim 11, wherein the calculator block includes:
- a first decoder configured to decode the test mode signal;
- a fuse encoder configured to provide a fuse encoding signal having the plurality of bits by encoding the fuse coding signal;
- a test mode encoder configured to provide the addition and subtraction control signal having the plurality of bits, the addition flag signal, and the subtraction flag signal by encoding an output signal of the first decoder;
- an adder block configured to perform an addition operation relative to the fuse encoding signal, the addition and subtraction control signal, the addition flag signal, and the subtraction flag signal; and
- a second decoder configured to provide the trimming code signal group by decoding an output signal of the adder block.

13. The trimming circuit as claimed in claim 12, wherein the fuse encoder is configured to provide the addition and subtraction control signal having one of addition information and subtraction information, and information on addition and subtraction degree.

14. The trimming circuit as claimed in claim 13, wherein the fuse encoder is configured to provide code information on desired subtraction as the addition and subtraction control signal by using a complementary signal of a binary bit.

15. The trimming circuit as claimed in claim 12, wherein the adder block includes a plurality of adders for receiving the fuse encoding signal and the addition and subtraction control signal, and is configured to provide an operation result and a carry signal according to each of the plurality of bits.

16. A trimming circuit for a semiconductor memory apparatus, comprising:
- a plurality of internal voltage generators, each configured to generate various trimming target internal voltages;
- a test mode controller configured to generate a plurality of voltage control signals, each corresponding to one of the plurality of trimming target internal voltages; and
- a calculator block controlled by the plurality of voltage control signals and a test mode signal and configured to selectively provide a trimming code signal group corresponding to each of the plurality of internal voltage generators by using fuse coding information of each of the plurality of internal voltage generators, wherein
- the test mode controller is configured to provide the plurality of voltage control signals using a trimming flag signal and a plurality of voltage flags representing each of the plurality of trimming target internal voltages.

17. The trimming circuit as claimed in claim 16, wherein the calculator block is configured to provide the trimming code signal group to a corresponding one of the plurality of internal voltage generators in response to one of the plurality of activated voltage control signals.

18. The trimming circuit as claimed in claim 17, wherein none of the plurality of voltage control signals is simultaneously activated.

19. The trimming circuit as claimed in claim 16, wherein the calculator block is configured to perform addition and subtraction operations using the fuse coding signal corresponding to each internal voltage in response to the test mode signal serving as a code variation information signal.

20. The trimming circuit as claimed in claim 19, wherein the calculator block includes:
- a first decoder configured to decode the test mode signal; a fuse encoder configured to provide a fuse encoding signal having a plurality of bits by encoding the fuse coding signal;
- a test mode encoder configured to provide an addition and subtraction control signal having a plurality of bits, an addition flag signal, and a subtraction flag signal by encoding an output signal of the first decoder;
- an adder block configured to perform an addition operation relative to the fuse encoding signal, the addition and subtraction control signal, the addition flag signal, and the subtraction flag signal; and
- a second decoder configured to provide the trimming code signal group by decoding an output signal of the adder block.

21. The trimming circuit as claimed in claim 20, wherein the fuse encoder is configured to provide the addition and subtraction control signal having one of addition information and subtraction information, and information on addition and subtraction degree.

22. The trimming circuit as claimed in claim 21, wherein the fuse encoder is configured to provide code information on desired subtraction as the addition and subtraction control signal by using a complementary signal of a binary bit.

23. The trimming circuit as claimed in claim 20, wherein the adder block includes a plurality of adders for receiving the fuse encoding signal and the addition and subtraction control signal, and is configured to provide an operation result and a carry signal according to each bit.

24. The trimming circuit as claimed in claim 16, wherein each of the plurality of internal voltage generators is configured to provide trimmed voltage as each of the plurality of internal output voltages in response to the corresponding trimming code signal group.

25. A method of trimming a semiconductor memory apparatus, comprising:
- providing a fuse coding signal by decoding fuse cutting information in a wafer level;
- decoding the test mode signal;
- providing a fuse encoding signal having a plurality of bits by encoding the fuse coding signal;
- providing an addition and subtraction control signal having the plurality of bits, an addition flag signal, and a subtraction flag signal by encoding an output signal of the first decoder;
- performing an addition operation relative to the fuse encoding signal, the addition and subtraction control signal, the addition flag signal, the test mode signal, and the subtraction flag signal;
- providing the trimming code signal group by decoding an output signal of the adder block; and
- providing trimmed voltage in response to the trimming code signal group as output voltage.

26. The method as claimed in claim 25, wherein the addition and subtraction control signal includes one of addition information and subtraction information, and information on addition and subtraction degree.

27. A method of trimming a semiconductor memory apparatus, comprising:

generating a plurality of trimming target internal voltages;

generating a plurality of voltage control signals, each corresponding to one of the plurality of trimming target internal voltages; and providing a trimming code signal group corresponding to each of the plurality of internal voltage generators by using fuse coding information of each of the plurality of internal voltage generators based upon the plurality of voltage control signals and a test mode signal, wherein the generating the plurality of voltage control signals includes using a trimming flag signal and a plurality of voltage flags representing each of the plurality of trimming target internal voltages.

28. The method as claimed in claim 27, wherein none of the plurality of voltage control signals is simultaneously activated.

* * * * *